United States Patent
Ban et al.

(10) Patent No.: US 10,128,670 B2
(45) Date of Patent: Nov. 13, 2018

(54) METHOD FOR CONFIRMING CONTACT WITH FLUID AND ELECTRONIC DEVICE THEREFOR

(71) Applicant: Samsung Electronics Co., Ltd., Gyeonggi-do (KR)

(72) Inventors: Youngkyun Ban, Gyeonggi-do (KR); Soyoung Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 127 days.

(21) Appl. No.: 15/165,239

(22) Filed: May 26, 2016

(65) Prior Publication Data

US 2017/0063117 A1 Mar. 2, 2017

(30) Foreign Application Priority Data

Aug. 27, 2015 (KR) .................... 10-2015-0121011

(51) Int. Cl.
*H02J 7/00* (2006.01)
*H02J 7/14* (2006.01)
(Continued)

(52) U.S. Cl.
CPC .......... *H02J 7/0031* (2013.01); *G01R 27/22* (2013.01); *H02J 7/007* (2013.01); *H02J 7/0044* (2013.01);
(Continued)

(58) Field of Classification Search
USPC ....... 320/107, 134, 103, 118, 136, 106, 108, 320/114, 115, 128, 135, 109, 110, 113,
(Continued)

(56) References Cited

U.S. PATENT DOCUMENTS 8,363,425 B2 * 1/2013 Rupert ................ H01M 10/486 180/2.1
2009/0085514 A1 * 4/2009 Mizoguchi ............ H02J 7/0042 320/113

(Continued)

FOREIGN PATENT DOCUMENTS

JP 2007-149588 A 6/2007
KR 10-2007-0096452 A 10/2007
KR 10-2014-0123802 A 10/2014

*Primary Examiner* — Alexis Pacheco
(74) *Attorney, Agent, or Firm* — Cha & Reiter, LLC.

(57) ABSTRACT

The present disclosure relates to a method and apparatus for determining whether an electronic device contacts a fluid or not. The electronic device may include: a housing; at least one sensor arranged in the housing; a coupling member connected to a part of the housing and configured to detachably couple the electronic device to a part of a body of a user; a conductive member arranged on a surface of the housing or on a surface of the coupling member and exposed to an outside while being electrically connectible to the at least one sensor; a processor electrically connected to the at least one sensor and the conductive member; and a memory electrically connected to the processor. The processor determines whether the conductive member has contacted a fluid or not using the at least one sensor and executes a second action at least partially based on the determination.

19 Claims, 15 Drawing Sheets

(51) Int. Cl.
*G01R 27/22* (2006.01)
*H02J 7/02* (2016.01)

(52) U.S. Cl.
CPC ........... *H02J 7/0047* (2013.01); *H02J 7/0054* (2013.01); *H02J 7/0068* (2013.01); *H02J 7/025* (2013.01)

(58) Field of Classification Search
USPC .......... 320/116, 124; 361/679.01, 679.03, 78
See application file for complete search history.

(56) References Cited

U.S. PATENT DOCUMENTS

| | | | | |
|---|---|---|---|---|
| 2011/0050175 | A1* | 3/2011 | Odaohhara | H01M 10/443 320/134 |
| 2013/0020986 | A1* | 1/2013 | Linzon | A43B 3/0015 320/107 |
| 2014/0239904 | A1* | 8/2014 | Tanaka | B60R 16/04 320/128 |
| 2014/0307356 | A1* | 10/2014 | Hong | H02H 5/083 361/78 |
| 2015/0137731 | A1* | 5/2015 | Kim | H02J 7/355 320/101 |
| 2015/0188347 | A1* | 7/2015 | Ruan | H02J 7/0031 320/118 |
| 2015/0270734 | A1* | 9/2015 | Davison | H02J 7/0054 320/103 |
| 2015/0340891 | A1* | 11/2015 | Fish | H02J 7/0042 320/103 |
| 2016/0241059 | A1* | 8/2016 | Li | H04M 1/18 |

\* cited by examiner

US 10,128,670 B2

METHOD FOR CONFIRMING CONTACT WITH FLUID AND ELECTRONIC DEVICE THEREFOR

CLAIM OF PRIORITY

This application claims the benefit of priority under 35 U.S.C. § 119(a) from Korean Application Serial No. 10-2015-0121011, which was filed in the Korean Intellectual Property Office on Aug. 27, 2015, the entire content of which is hereby incorporated by reference.

BACKGROUND

1. Field of the Disclosure

Various embodiments of the present disclosure relate to a device and a method for confirming whether an electronic device makes a contact with a fluid or not.

2. Description of the Related Art

Electronic devices, such as portable terminals, tablet computers, and smartphones, use batteries as power supply means and thereby provide mobility such that users can carry such electronic devices with increased convenience.

Electronic devices, as carried by users more frequently, may be exposed to contact with a fluid under various conditions of external environments.

SUMMARY

Supply of power to an electronic device, while at least a part thereof is contacting a fluid (for example, water), may cause the electronic device to malfunction. For example, when an electronic device is charged through a connector, which contacts a fluid, the difference in electric potential between terminals resulting from the layer of water may corrode the electrode of the connector.

Various embodiments of the present disclosure may provide a device and a method for confirming, in connection with an electronic device, whether at least a part of the electronic device contacts a fluid or not.

According to various embodiments of the present disclosure, an electronic device may include: a housing; at least one sensor arranged in the housing; a coupling member connected to a part of the housing and configured to detachably couple the electronic device to a part of a body of a user; a conductive member arranged on a surface of the housing or on a surface of the coupling member and exposed to an outside while being electrically connectible to the at least one sensor; a processor electrically connected to the at least one sensor and the conductive member; and a memory electrically connected to the processor, wherein the memory may store instructions that, when executed, causes the processor to acquire at least one item (e.g. piece, portion) of information related to the body of the user using the at least one sensor, to execute a first action based on the acquired information, to determine whether the conductive member has contacted a fluid or not using the at least one sensor, and to execute a second action at least partially based on the determination.

According to various embodiments of the present disclosure, a method for operating an electronic device may include the operations of: acquiring at least one item of information related to a body of a user using at least one sensor; executing a first action based on the acquired information; determining whether a conductive member has contacted a fluid or not using the at least one sensor; and executing a second action at least partially based on the determination, wherein the conductive member is exposed to an outside while being electrically connectible to the at least one sensor.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
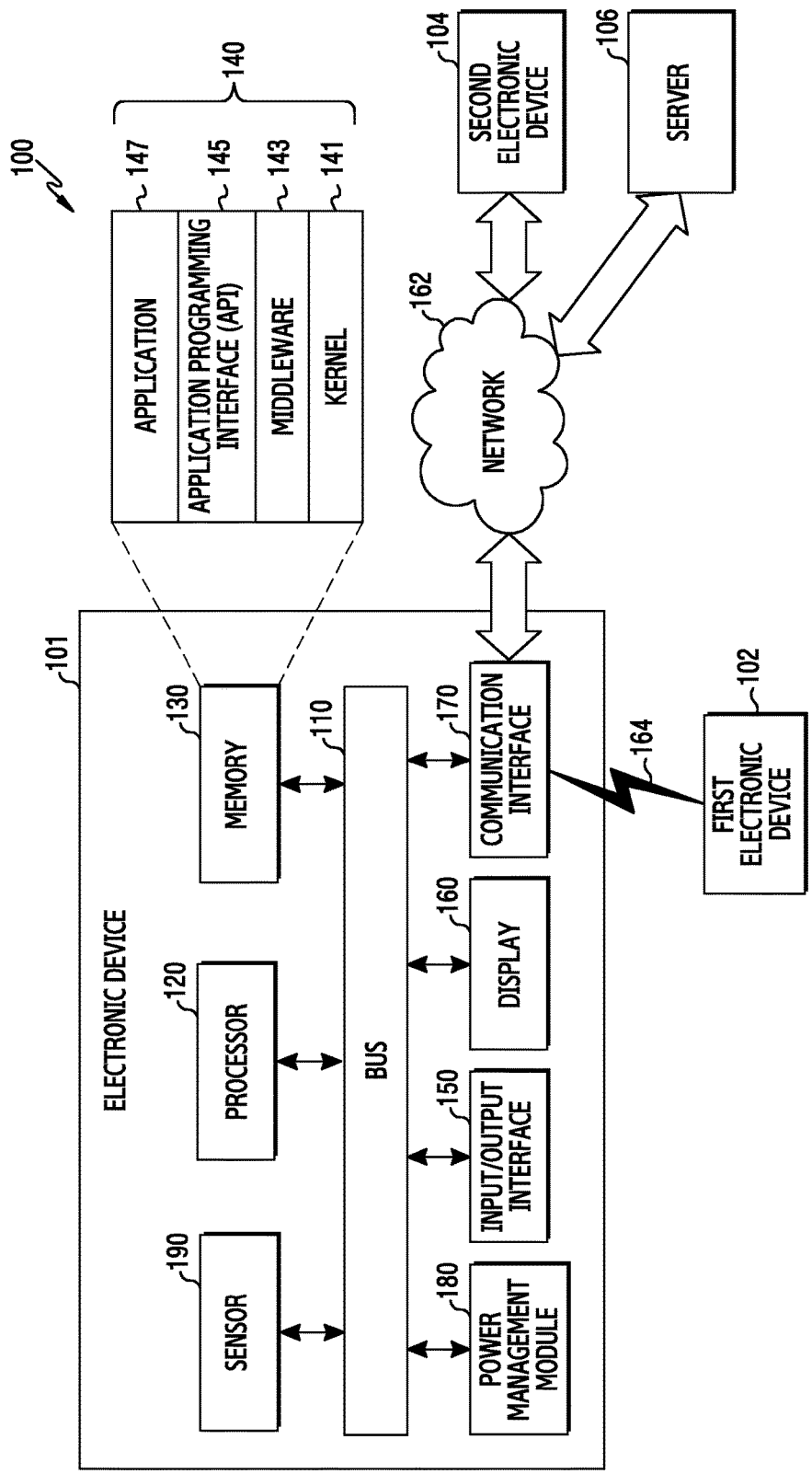
FIG. 1 illustrates an electronic device in a network environment according to various embodiments of the present disclosure.

Hereinafter, various embodiments of the present disclosure will be described with reference to the accompanying drawings. In the following description, specific details such as detailed configuration and components are merely provided to assist the overall understanding of these embodiments of the present disclosure. Therefore, it should be apparent to those skilled in the art that various changes and modifications of the embodiments described herein can be made without departing from the scope and spirit of the present disclosure. In addition, descriptions of well-known functions and constructions are omitted for clarity and conciseness.

The present disclosure may have various embodiments, and modifications and changes may be made therein. Therefore, the present disclosure will be described in detail with reference to particular embodiments shown in the accompanying drawings. However, it should be understood that the present disclosure is not limited to the particular embodiments, but includes all modifications/changes, equivalents, and/or alternatives falling within the spirit and the scope of the present disclosure. In describing the drawings, similar reference numerals may be used to designate similar elements. Moreover, for written description and enablement purposes, unless expressed to the contrary, elements of one embodiment may be used in one or more different embodiment(s), as the various embodiments are shown to illustrate some, but not all, of the variations of the combination of elements that constitute the appended claims.

The terms "have", "may have", "include", or "may include" used in the various embodiments of the present disclosure indicate the presence of disclosed corresponding functions, operations, elements, and the like, and do not limit additional one or more functions, operations, elements, and the like. In addition, it should be understood that the terms "include" or "have" used in the various embodiments of the present disclosure are to indicate the presence of features, numbers, steps, operations, elements, parts, or a combination thereof described in the specifications, and do not preclude the presence or addition of one or more other features, numbers, steps, operations, elements, parts, or a combination thereof.

The terms "A or B", "at least one of A or/and B" or "one or more of A or/and B" used in the various embodiments of the present disclosure include any and all combinations of words enumerated with it. For example, "A or B", "at least one of A and B" or "at least one of A or B" means (1) including at least one A, (2) including at least one B, or (3) including both at least one A and at least one B.

Although the term such as "first" and "second" used in various embodiments of the present disclosure may modify various elements of various embodiments, these terms do not limit the corresponding elements. For example, these terms do not limit an order and/or importance of the corresponding elements. These terms may be used for the purpose of distinguishing one element from another element. For example, a first user device and a second user device all indicate user devices and may indicate different user devices. For example, a first element may be named a second element without departing from the scope of right of various embodiments of the present disclosure, and similarly, a second element may be named a first element.

It will be understood by a person of ordinary skill in the art that when an element (e.g., first element) is "connected to" or "(operatively or communicatively) coupled with/to to another element (e.g., second element), the element may be directly connected or coupled to another element, and there may be an intervening element (e.g., third element) between the element and another element. To the contrary, it will be understood by a person or ordinary skill in the art reading this disclosure that when an element (e.g., first element) is "directly connected" or "directly coupled" to another element (e.g., second element), there is no intervening element (e.g., third element) between the element and another element.

The expression "configured to (or set to)" used in various embodiments of the present disclosure may be replaced with "suitable for", "having the capacity to", "designed to", "adapted to", "made to", or "capable of" according to a situation. The term "configured to (set to)" does not necessarily mean "specifically designed to" in a hardware level. Instead, the expression "apparatus configured to . . . " may mean that the apparatus is "capable of . . . " along with other devices or parts in a certain situation. For example, "a processor configured to (set to) perform A, B, and C" may be a dedicated processor, e.g., an embedded processor, for performing a corresponding operation, or a generic-purpose processor, e.g., a Central Processing Unit (CPU) or an application processor (AP), capable of performing a corresponding operation by executing one or more software programs stored in a memory device.

The terms as used herein are used merely to describe certain embodiments and are not intended to limit the present disclosure. As used herein, singular forms may include plural forms as well unless the context explicitly indicates otherwise. Further, all the terms used herein, including technical and scientific terms, should be interpreted to have the same meanings as commonly understood by those skilled in the art to which the present disclosure pertains, and should not be interpreted to have ideal or excessively formal meanings unless explicitly defined in various embodiments of the present disclosure.

An electronic device according to various embodiments of the present disclosure may be a device. For example, the electronic device according to various embodiments of the present disclosure may include at least one of: a smart phone; a tablet personal computer (PC); a mobile phone; a video phone; an e-book reader; a desktop PC; a laptop PC; a netbook computer; a workstation, a server, a personal digital assistant (PDA); a portable multimedia player (PMP); an MP3 player; a mobile medical device; a camera; a power bank; or a wearable device (e.g., a head-mount-device (HMD), an electronic glasses, an electronic clothing, an electronic bracelet, an electronic necklace, an electronic appcessory, an electronic tattoo, a smart mirror, or a smart watch, just to name a few non-limiting possible devices.

In other embodiments, an electronic device may include at least one of: a medical equipment (e.g., a mobile medical device (e.g., a blood glucose monitoring device, a heart rate monitor, a blood pressure monitoring device or a temperature meter)); a navigation device; a global positioning system (GPS) receiver; an event data recorder (EDR); a flight data recorder (FDR); an in-vehicle infotainment device; an electronic equipment for a ship (e.g., ship navigation equipment and/or a gyrocompass); an avionics equipment; a security equipment; a head unit for vehicle; an industrial or home robot; an automatic teller's machine (ATM) of a financial institution, point of sale (POS) device at a retail store, or an internet of things device (e.g., a Lightbulb, various sensors, an electronic meter, a gas meter, a sprinkler, a fire alarm, a thermostat, a streetlamp, a toaster, a sporting equipment, a hot-water tank, a heater, or a boiler and the like)

Further, it will be apparent to those skilled in the art that an electronic device according to various embodiments of the present disclosure and the append claims is not limited to the above-mentioned devices shown and described herein for illustrative purposes.

Herein, the term "user" may indicate a person who uses an electronic device or a device (e.g., an artificial intelligence electronic device) that uses the electronic device.

FIG. 1 illustrates a network environment including an electronic device according to various embodiments.

The electronic device 101 in the network environment 100, according to the various embodiments, will be described below with reference to FIG. 1. The electronic device 101 may include a bus 110, a processor 120, a memory 130, an input/output interface 150, a display 160, a communication interface 170, a power management module 180 and a sensor 190. In an embodiment, at least one of the elements of the electronic device 101 may be omitted, or other elements may be additionally included in the electronic device 101.

The bus 110 may include, for example, a circuit that interconnects the elements 110 to 170 and transfers communication (e.g., a control message and/or data) between the elements.

The processor 120 may include one or more of a central processing unit (CPU), an application processor (AP), and a communication processor (CP). The processor 120 may, for example, perform an operation or data processing on control and/or communication of at least one other element of the electronic device 101.

According to an embodiment, the processor 120 may determine whether the electronic device 101 contacts a fluid or not, based on sensor data (for example, a resistance value caused by a conductive member) provided from a sensor 190 (for example, a GSR (galvanic skin reflex) sensor). For example, the processor 120 may compare a resistance value, which is provided from the sensor 190, with a reference resistance value and thereby determine whether the electronic device 101 contacts a fluid or not. For example, when the resistance value of the conductive member exceeds the reference resistance value, the processor 120 may determine that the corresponding electronic device 101 or the conductive member has contacted a fluid. For example, the resistance value of the conductive member may include a resistance value caused by an outer material (for example, skin, moisture, etc.) that has contacted the conductive member. The reference resistance value may include a resistance value defined as a reference for determining whether the electronic device 101 contacts a fluid or not. A contact of the electronic device with a fluid may include penetration by water of the electronic device in water. For example, the fluid may include a liquid, such as water, that has electric conductivity or a gas including moisture.

According to an embodiment, the processor 120 may conduct a control such that, when occurrence of an event for confirming whether a contact with a fluid has occurred or not is detected, information (for example, a voltage signal, current signal, a resistance value, etc.) regarding a conductive member (for example, a GSR electrode) is confirmed through the sensor 190. For example, the processor 120 may conduct a control such that, when detachment of the electronic device 101 from the user is sensed, the sensor 190 and the conductive member are connected. For example, the conductive member may include an element of the electronic device 101, which protrudes to the outside of the electronic device 101 and has electric conductivity, such as an antenna radiator, a connector pin, or an outer electrode.

According to an embodiment, the processor 120 may deactivate the charging function of the electronic device 101 when a fluid contact of the electronic device 101 is confirmed. For example, when the processor 120 has confirmed a fluid contact of a conductive member (for example, a connector), to which an external power supply is connected, the processor 120 may release the connection between the conductive member and the power management module 180, thereby deactivating the charging function (for example, a wired charging function) of the electronic device 101. For example, the charging function may include a series of operations that accumulate energy (for example, chemical energy) in the battery using an external power supply connected through the conductive member.

According to an embodiment, the processor 120 may conduct a control such that fluid contact information is output. For example, the processor 120 may control the display 160 so as to display fluid contact information.

According to an embodiment, the processor 120 may activate the charging function of the electronic device 101 when release of the fluid contact of the electronic device 101 is confirmed. For example, when the processor 120 has confirmed a fluid contact of the conductive member (for example, a connector), the processor 120 may confirm whether the conductive member contacts the fluid or not using the sensor 190 periodically or based on the user's input. When it is determined that the conductive member has not contacted any fluid, the processor 120 may connect the conductive member and the power management module 180, thereby activating the charging function of the electronic device 101. According to an embodiment, the processor 120 may conduct a control such that fluid contact release information is output. For example, the processor 120 may control the display 160 so as to display fluid contact release information.

According to an embodiment, the processor 120 may perform sensor correction (i.e. sensor adjustment) when a fluid contact of the electronic device 101 is confirmed. For example, when the electronic device 101 has contacted a fluid, a change in capacitance may be detected, even if there is no touch input, by a layer of water formed on the touch screen or the touch sensor. Therefore, when a fluid contact of the electronic device 101 has been confirmed, the processor 120 may correct the touch recognition of the touch screen or the touch sensor lest the layer of water should cause erroneous touch recognition. For example, when a fluid contact of the electronic device 101 has been confirmed, the processor 120 may adjust the barometer sensor so as to correspond to the difference in atmospheric pressure between the inside and outside of water. For example, when a fluid contact of the electronic device 101 has been confirmed, the processor 120 may correct (i.e. adjust) the white balance of the camera module so as to correspond to the distortion of color sense inside water.

According to an embodiment, the processor 120 may determine the fluid contact range (for example, water penetration range) of the electronic device 101 based on the fluid contact time of the electronic device 101. For example, the processor 120 may periodically confirm whether the electronic device 101 contacts a fluid or not using the sensor 190. The processor 120 may estimate the fluid contact time of the electronic device 101 based on the confirmed number of consecutive fluid contacts of the electronic device 101. The processor 120 may confirm whether the fluid contact time reference of the reference water penetration range (for example, IP67) is exceeded or not, based on the fluid contact time of the electronic device 101.

According to an embodiment, the processor 120 may interrupt power supply of the electronic device 101 when the fluid contact time of the electronic device 101 exceeds the fluid contact time reference of the reference water penetration range.

The memory 130 may include a volatile memory and/or a non-volatile memory. The memory 130 may store, for example, instructions or data relevant to at least one other element of the electronic device 101. For example, the memory 130 may store at least one of a reference resistance value and reference water penetration range information, which are for the purpose of determining whether the electronic device 101 contacts a fluid or not.

According to an embodiment, the memory 130 may store software and/or a program 140. For example, the program may include a kernel 141, middleware 143, an application programming interface (API) 145, and an application program (or "application") 147. At least some of the kernel 141, the middleware 143, and the API 145 may be referred to as an Operating System (OS).

The kernel 141 may control or manage system resources (e.g., the bus 110, the processor 120, or the memory 130) used for performing an operation or function implemented by the other programs (e.g., the middleware 143, the API 145, or the application programs 147). Furthermore, the kernel 141 may provide an interface through which the middleware 143, the API 145, or the application programs 147 may access the individual elements of the electronic device 101 to control or manage the system resources.

The middleware 143, for example, may function as an intermediary for allowing the API 145 or the application programs 147 to communicate with the kernel 141 to exchange data.

In addition, the middleware 143 may process one or more task requests received from the application programs 147 according to priorities thereof. For example, the middleware 143 may assign priorities for using the system resources (e.g., the bus 110, the processor 120, the memory 130, or the like) of the electronic device 101, to at least one of the application programs 147. For example, the middleware 143 may perform scheduling or loading balancing on the one or more task requests by processing the one or more task requests according to the priorities assigned thereto.

The API 145 is an interface through which the applications 147 control functions provided from the kernel 141 or the middleware 143, and may include, for example, at least one interface or function (e.g., instruction) for file control, window control, image processing, or text control.

The input/output interface 150, for example, may function as an interface that may transfer instructions or data input from a user or another external device to the other element(s) of the electronic device 101. Furthermore, the input/output interface 150 may output the instructions or data received from the other element(s) of the electronic device 101 to the user or another external device.

Examples of the display 160 may include a Liquid Crystal Display (LCD), a Light-Emitting Diode (LED) display, an Organic Light-Emitting Diode (OLED) display, a MicroElectroMechanical Systems (MEMS) display, and an electronic paper display. The display 160, for example, may display various types of content (e.g., text, images, videos, icons, or symbols) to the user. The display 160 may include a touch screen and receive, for example, a touch, gesture, proximity, or hovering input using an electronic pen or the user's body part.

According to an embodiment, the display 160 may display fluid contact information on at least a part of the display area when the processor 120 has determined that the electronic device 101 has contacted a fluid. The display 160 may display fluid contact release information on at least a part of the display area when the processor 120 has determined that the fluid contact of the electronic device 101 has been released.

The communication interface 170, for example, may set communication between the electronic device 101 and an external device (e.g., the first external electronic device 102, the second external electronic device 104, or a server 106). For example, the communication interface 170 may be connected to a network 162 through wireless or wired communication to communicate with the external device (e.g., the second external electronic device 104 or the server 106). Thus, if fluid is detected the electronic device 101 may provided notification to a remotely located device, for example, via a server or a wireless transmission directly to another device.

The wireless communication may use at least one of, but is not limited to, for example, Long Term Evolution (LTE), LTE-Advance (LTE-A), Code Division Multiple Access (CDMA), Wideband CDMA (WCDMA), Universal Mobile Telecommunications System (UMTS), WiBro (Wireless Broadband), and Global System for Mobile Communications (GSM), as a cellular communication protocol. In addition, the wireless communication may include, for example, short range communication 164. The short-range communication 164 may be performed by using at least one of, for example, Wi-Fi, Bluetooth, Near Field Communication (NFC), and Global Navigation Satellite System (GNSS). The GNSS may include at least one of, for example, a Global Positioning System (GPS), a Global navigation satellite system (Glonass), a Beidou navigation satellite system (hereinafter, referred to as "Beidou"), and Galileo (European global satellite-based navigation system). Hereinafter, in the present disclosure, the "GPS" may be interchangeably used with the "GNSS". The wired communication may include at least one of, for example, a Universal Serial Bus (USB), a High Definition Multimedia Interface (HDMI), Recommended Standard-232 (RS-232), and a Plain Old Telephone Service (POTS). The network 162 may include at least one of a communication network such as a computer network (e.g., a LAN or a WAN), the Internet, and a telephone network.

Each of the first and second external electronic devices 102 and 104 may be of a type that is identical to or different from that of the electronic device 101. According to an embodiment, the server 106 may include a group of one or more servers. According to various embodiments, all or some of the operations performed in the electronic device 101 may be performed in another electronic device or a plurality of electronic devices (e.g., the electronic devices 102 and 104 or the server 106). According to an embodiment, when the electronic device 101 has to perform some functions or services automatically or in response to a request, the electronic device 101 may make a request for performing at least some functions relating thereto to another device (e.g., the electronic device 102 or 104 or the server 106) instead of performing the functions or services by itself or in addition. Another electronic device (e.g., the electronic device 102 or 104 or the server 106) may execute the requested functions or the additional functions, and may deliver a result of the execution to the electronic device 101. The electronic device 101 may process the received result as it is or additionally to provide the requested functions or services. To achieve this, for example, cloud computing, distributed computing, or client-server computing technology may be used.

The power management module 180 includes hardware such as a microprocessor that may control charging and discharging of the battery of the electronic device 101. According to an embodiment, the power management module 180 may include a PMIC (power management integrated circuit) or a charger IC (charger integrated circuit).

The sensor 190 may provide the processor 120 with information (for example, resistance value) acquired by supplying a current to at least one electrode. For example, the sensor 190 may include a GSR sensor. For example, the at least one electrode may include at least some pins of the connector or an outer electrode, as at least a part of the conductive member. The connector may include a USB connector or a Pogo connector. According to various embodiments of the present disclosure, the electronic device 101 can determine whether itself or the conductive member in contact therewith contacts a fluid. This determination may be made through a control module separate from the processor 120.

Figure 2:
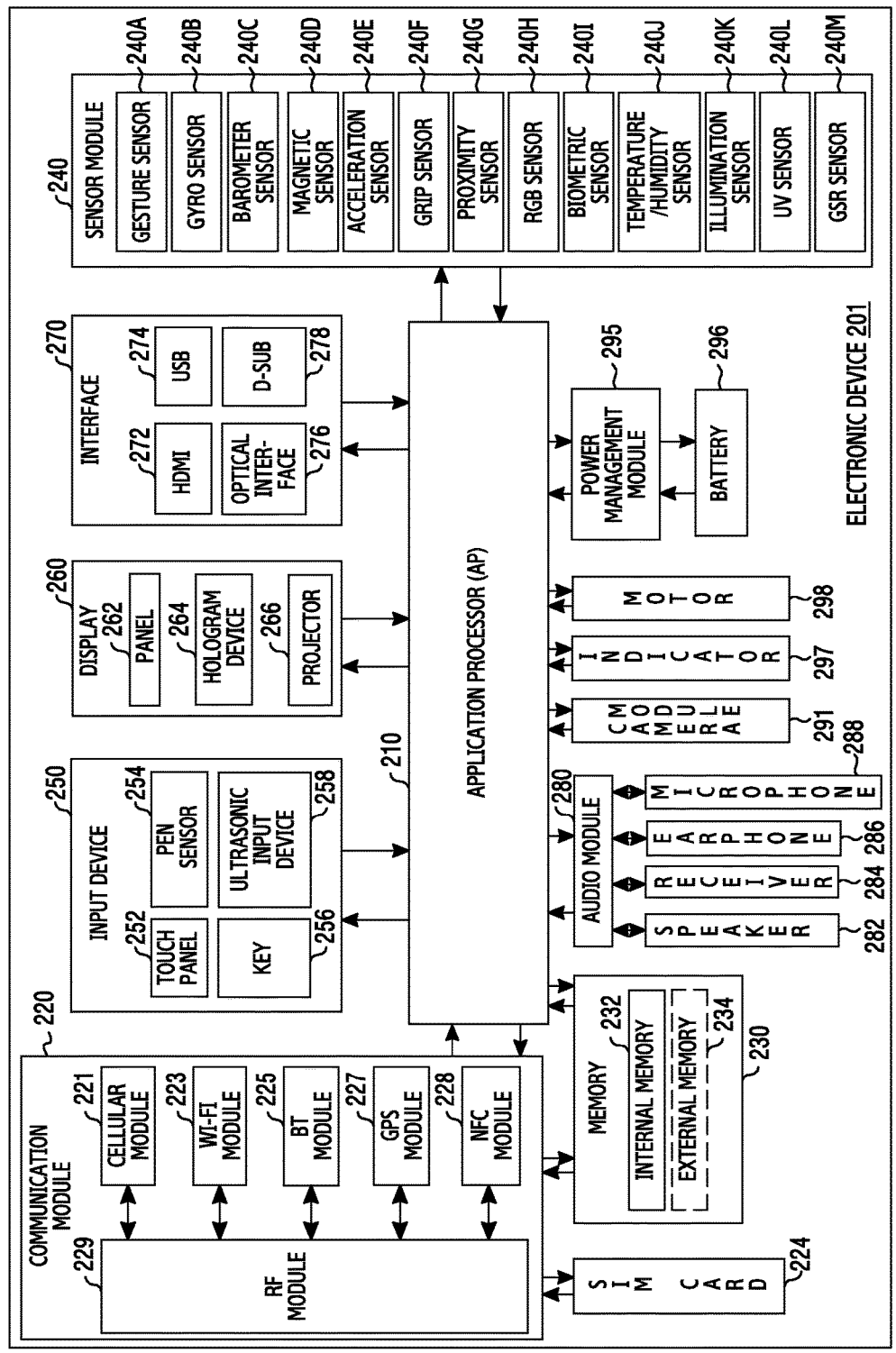
FIG. 2 is a block diagram of an electronic device according to various embodiments of the present disclosure.

FIG. 2 is a block diagram of an electronic device 201 according to various embodiments. The electronic device 201 may include, for example, all or a part of the electronic device 101 illustrated in FIG. 1. The electronic device 201 may include at least one application processor (AP) 210, a communication module 220, a subscriber identification module (SIM) card 224, a memory 230 (e.g. non-transitory memory), a sensor module 240, an input device 250, a display 260, an interface 270, an audio module 280, a camera module 291, a power management module 295, a battery 296, an indicator 297, and a motor 298.

The AP 210 which comprises hardware circuitry configured for operation, may, for example, control a plurality of hardware or software elements connected thereto and perform a variety of data processing and calculations by driving an operating system or application programs. The AP 210 may be implemented as, for example, a system on chip (SoC). According to an embodiment, the AP 210 may further include a graphic processing unit (GPU) and/or an image signal processor. The AP 210 may include at least some of the elements (e.g., a cellular module 221) illustrated in FIG. 2. The AP 210 may load commands or data, received from at least one other element (e.g., a non-volatile memory), in a volatile memory to process the loaded commands or data, and may store various types of data in the non-volatile memory.

The communication module 220 includes hardware such as a transmitter, receiver, or transceiver, and may have one or more antennas coupled thereto, may have a configuration that is the same as or similar to that of the communication interface 160 of FIG. 1. The communication module 220 may include, for example, a cellular module 221, a Wi-Fi module 223, a BT module 225, a GPS module 227, an NFC module 228, and a radio frequency (RF) module 229. The communication module 220 provides a function of transmitting/receiving a signal. Accordingly, the communication module 220 may be referred to as a "reception unit", a "transmission unit", a "transmission and reception unit", a "communication unit", or the like, and all constitute statutory elements in accordance with 35 U.S.C. 101.

The cellular module 221 may provide, for example, a voice call, a video call, a text message service, or an Internet service through a communication network. According to an embodiment, the cellular module 221 may distinguish and authenticate the electronic device 201 in the communication network by using a subscriber identification module (e.g., the SIM card 224). According to an embodiment, the cellular module 221 may perform at least some of the functions that the AP 210 may provide. According to an embodiment, the cellular module 221 may include a communication processor (CP).

The Wi-Fi module 223, the BT module 225, the GPS module 227, or the NFC module 228 may include, for example, a processor for processing data transmitted/received through the corresponding module. According to an embodiment, at least some (e.g., two or more) of the cellular module 221, the Wi-Fi module 223, the BT module 225, the GPS module 227, and the NFC module 228 may be included in a single integrated chip (IC) or IC package.

The RF module 229 may, for example, transmit/receive a communication signal (e.g., an RF signal). The RF module 229 may include, for example, a transceiver, a power amp module (PAM), a frequency filter, a low noise amplifier (LNA), or an antenna. According to another embodiment, at least one of the cellular module 221, the Wi-Fi module 223, the BT module 225, the GPS module 227, and the NFC module 228 may transmit/receive an RF signal through a separate RF module.

The SIM card 224 may include, for example, a card including a subscriber identification module and/or an embedded SIM, and may further include unique identification information (e.g., an integrated circuit card identifier (ICCID)) or subscriber information (e.g., international mobile subscriber identity (IMSI)).

The memory 230 may include, for example, an internal memory 232 or an external memory 234. The internal memory 232 may include, for example, at least one of a volatile memory (e.g., a dynamic random access memory (DRAM), a static RAM (SRAM), a synchronous dynamic RAM (SDRAM), or the like) and a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), a hard disc drive, or a solid state drive (SSD)).

The external memory 234 may further include a flash drive, for example, a compact flash (CF), a secure digital (SD), a micro secure digital (Micro-SD), a mini secure digital (Mini-SD), an extreme digital (xD), a memory stick, or the like. The external memory 234 may be functionally and/or physically connected to the electronic device 201 through various interfaces.

The sensor module 240 may, for example, measure a physical quantity or detect an operating state of the electronic device 201, and may convert the measured or detected information into an electrical signal. The sensor module 240 may include, for example, at least one of, a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., red, green, and blue (RGB) sensor), a bio-sensor 240I, a temperature/humidity sensor 240J, an illumination sensor 240K, and a ultra violet (UV) sensor 240M. Additionally or alternatively, the sensor module 240 may include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling one or more sensors included therein. In an embodiment, the electronic device 201 may further include a processor that is configured as a part of the AP 210 or a separate element from the AP 210 in order to control the sensor module 240, thereby controlling the sensor module 240 while the AP 2710 is in a sleep state.

The input device 250 may include, for example, a touch panel 252, a (digital) pen sensor 254, a key 256, or an ultrasonic input device 258. The touch panel 252 may use at least one of, for example, a capacitive type, a resistive type, an infrared type, and an ultrasonic type. In addition, the touch panel 252 may further include a control circuit. The touch panel 252 may further include a tactile layer to provide a tactile reaction to a user.

The (digital) pen sensor 254 may be, for example, a part of the touch panel, or may include a separate recognition sheet. The key 256 may include, for example, a physical button, an optical key, or a keypad. The ultrasonic input device 258 may identify data by detecting acoustic waves with a microphone (e.g., a microphone 288) of the electronic device 201 through an input unit for generating an ultrasonic signal.

The display 260 (e.g., the display 160) may include a panel 262, a hologram device 264, or a projector 266. The panel 262 may include a configuration that is the same as or similar to that of the display 160 of FIG. 1. The panel 262 may be implemented to be, for example, flexible, transparent, or wearable. The panel 262 may be configured as a single module integrated with the touch panel 252. The hologram device 264 may show a stereoscopic image in the air using interference of light. The projector 266 may project light onto a screen to display an image. The screen may be located, for example, in the interior of or on the exterior of the electronic device 201. According to an embodiment, the display 260 may further include a control circuit for controlling the panel 262, the hologram device 264, or the projector 266.

The interface 270 may include, for example, a high-definition multimedia interface (HDMI) 272, a universal serial bus (USB) 274, an optical interface 276, or a D-sub-miniature (D-sub) 278. The interface 270 may be included in, for example, the communication interface 160 illustrated in FIG. 1. Additionally or alternatively, the interface 270 may include, for example, a mobile high-definition link (MHL) interface, a secure digital (SD) card/multi-media card (MMC) interface, or an infrared data association (IrDA) standard interface.

The audio module 280 may, for example, include hardware such as transducer to convert a sound into an electrical signal, and vice versa. At least some elements of the audio module 280 may be included in, for example, the input/output interface 140 illustrated in FIG. 1. The audio module 280 may, for example, process sound information that is input or output through the speaker 282, the receiver 284, the earphones 286, the microphone 288, or the like.

The camera module 291 may be, for example, a device that includes hardware and can capture a still image or a moving image, and according to an embodiment, the camera module 291 may include one or more image sensors (e.g., a front sensor or a rear sensor, CCD, CMOS, etc.), a lens, an image signal processor (ISP), or a flash (e.g., an LED or a xenon lamp).

The power management module 295 (e.g., the power management module 180) may, for example, manage power of the electronic device 201. According to an embodiment, the power management module 295 may include a power management integrated circuit (PMIC), a charger integrated circuit (IC), or a battery or fuel gauge. The power management module 295 may have a wired and/or wireless charging scheme. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature while charging. The battery 296 may include, for example, a rechargeable battery and/or a solar battery.

The indicator 297 may indicate a specific state of the electronic device 201 or a part thereof (e.g., the AP 210), for example, a booting state, a message state, a charging state, or the like, and may do so visually, audibly, by vibration, or any combination of the aforementioned. The motor 298 may convert an electrical signal into a mechanical vibration, and may generate a vibration or haptic effect. Although not illustrated, the electronic device 201 may include a processing unit (e.g., a GPU) for mobile TV support. The processing device for mobile TV support may, for example, process media data according to a standard of digital multimedia broadcasting (DMB), digital video broadcasting (DVB), media flow, or the like.

Each of the components of the electronic device according to the present disclosure may be implemented by one or more components and the name of the corresponding component may vary depending on a type of the electronic device. In various embodiments, the electronic device may include at least one of the above-described elements. Some of the above-described elements may be omitted from the electronic device, or the electronic device may further include additional elements. Further, some of the elements of the electronic device according to various embodiments of the present disclosure may be coupled to form a single entity while performing the same functions as those of the corresponding elements before the coupling.

Figure 3:
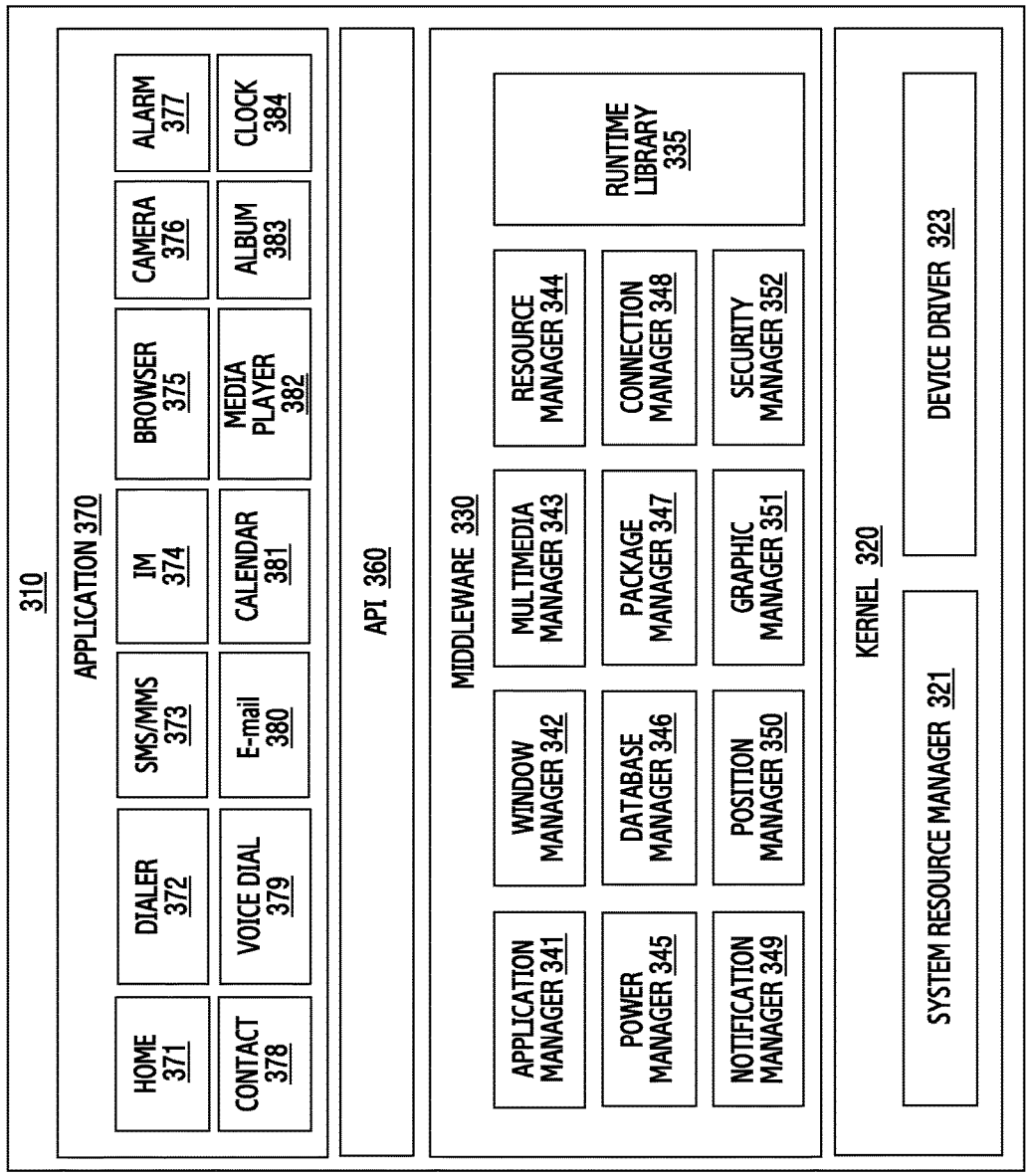
FIG. 3 is a block diagram of a program module according to various embodiments of the present disclosure.

FIG. 3 is a block diagram of a program module 310 according to various embodiments. According to an embodiment, the program module 310 (e.g., the program 140) may include machine executable code such as an operating system (OS) that when executed by one or more processors controls resources relating to an electronic device (e.g., the electronic device 101) and/or various applications (e.g., the application programs 147) executed in the operating system. The operating system may be, for example, Android, iOS™, Windows™, Symbian™, Tizen™, Bada™, or the like.

The programming module 310 may include a kernel 320, middleware 330, an application programming interface (API) 360, and/or applications 370. At least some of the program module 310 may be preloaded in the electronic device, or may be downloaded from a server (e.g., the server 106).

The kernel 320 (e.g., the kernel 141 of FIG. 1) may include, for example, a system resource manager 321 or a device driver 323. The system resource manager 321 may control, allocate, or collect system resources. According to an embodiment, the system resource manager 321 may include a process management unit, a memory management unit, or a file system management unit. The device driver 323 may include, for example, a display driver, a camera driver, a Bluetooth driver, a shared-memory driver, a USB driver, a keypad driver, a Wi-Fi driver, an audio driver, or an inter-process communication (IPC) driver.

The middleware 330 may provide a function required by the applications 370 in common, or may provide various functions to the applications 370 through the API 360 to enable the applications 370 to efficiently use limited system resources in the electronic device. According to an embodiment, the middleware 330 (e.g., the middleware 143) may include at least one of a run time library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include, for example, a library module used by a complier in order to add a new function through a programming language during the execution of the applications 370. The run time library 335 may perform input/output management, memory management, or a function for an arithmetic function.

The application manager 341 may manage, for example, a life cycle of at least one of the applications 370. The window manager 342 may manage GUI resources used by a screen. The multimedia manager 343 may identify a format required for reproducing various media files, and may encode or decode a media file using a codec suitable for the corresponding format. The resource manager 344 may manage resources of at least one of the applications 370, such as a source code, a memory, a storage space, and the like.

The power manager 345 may operate together with, for example, a basic input/output system (BIOS) to manage a battery or power and provide power information required for an operation of the electronic device. The database manager 346 may generate, search, or change a database to be used by at least one of the applications 370. The package manager 347 may manage installation or update of an application distributed in the format of a package file.

The connectivity manager 348 may manage, for example, a wireless connection, such as Wi-Fi or Bluetooth. The notification manager 349 may display or notify of an event, such as a received message, an appointment, and a proximity notification, in such a manner as not to disturb a user. The location manager 350 may manage location information of the electronic device. The graphic manager 351 may manage a graphic effect to be provided to a user, or a user interface related thereto. The security manager 352 may provide all security functions required for system security or user authentication. According to an embodiment, in cases where the electronic device (e.g., the electronic device 101) has a telephone call function, the middleware 330 may further include a telephony manager for managing a voice or video call function of the electronic device.

The middleware 330 may include a middleware module that forms combinations of various functions of the aforementioned elements. The middleware 330 may provide specialized modules according to the types of operating systems in order to provide differentiated functions. In addition, the middleware 330 may dynamically delete some of the existing elements, or may add new elements.

The API 360 (e.g., the API 145) may be, for example, a set of API programming functions, and may be provided with different configurations according to operating systems. For example, in the case of Android or iOS, one API set may be provided for each platform, and in the case of Tizen, two or more API sets may be provided for each platform.

The applications 370 (e.g., the application programs 147) may include, for example, one or more applications that can provide functions, such as home 371, dialer 372, SMS/MMS 373, instant message (IM) 374, browser 375, camera 376, alarm 377, contact 378, voice dialer 379, e-mail 380, calendar 381, media player 382, album 383, clock 384, health care (e.g., to measure exercise quantity or blood sugar), or environment information (e.g., atmospheric pressure, humidity, or temperature information).

According to an embodiment, the applications 370 may include an application (hereinafter, referred to as an "information exchange application" for convenience of the description) that supports information exchange between the electronic device (e.g., the electronic device 101) and external electronic devices (e.g., the electronic devices 102 and 104). The information exchange application may include, for example, a notification relay application for transmitting specific information to the external electronic device, or a device management application for managing the external electronic device.

For example, the notification relay application may include a function of transferring, to an external electronic device (e.g., the electronic device 102 or 104), notification information generated from other applications of the electronic device (e.g., an SMS/MMS application, an e-mail application, a health management application, or an environmental information application). Furthermore, the notification relay application may, for example, receive notification information from an external electronic device and provide the received notification information to a user. The device management application may, for example, manage (e.g., install, delete, or update) at least one function of an external electronic device (e.g., the electronic device 104) communicating with the electronic device (for example, a function of turning on/off the external electronic device itself (or some elements thereof), or a function of adjusting luminance (or a resolution) of the display), applications operating in the external electronic device, or services provided by the external electronic device (e.g., a telephone call service or a message service).

According to an embodiment, the applications 370 may include an application (e.g., a health care application) specified according to attributes (e.g., attributes of the electronic device such as the type of electronic device which corresponds to a mobile medical device) of the external electronic device (e.g., the electronic device 102 or 104). According to one embodiment, the applications 370 may include an application received from an external electronic device (e.g., the server 106 or the electronic device 102 or 104). According to an embodiment, the applications 370 may include a preloaded application or a third party application that can be downloaded from a server. The names of the elements of the program module 310, according to the embodiment illustrated in the drawing, may vary according to the type of operating system.

According to various embodiments, at least a part of the programming module 310 may be implemented in software that is executed by hardware, firmware, hardware, or a combination of two or more thereof. At least some of the programming module 310 may be implemented (for example, executed) by, for example, the processor (for example, the AP 210). At least some of the programming module 310 may include, for example, a module, program, routine, sets of instructions, process, or the like for performing one or more functions.

Figure 4A:
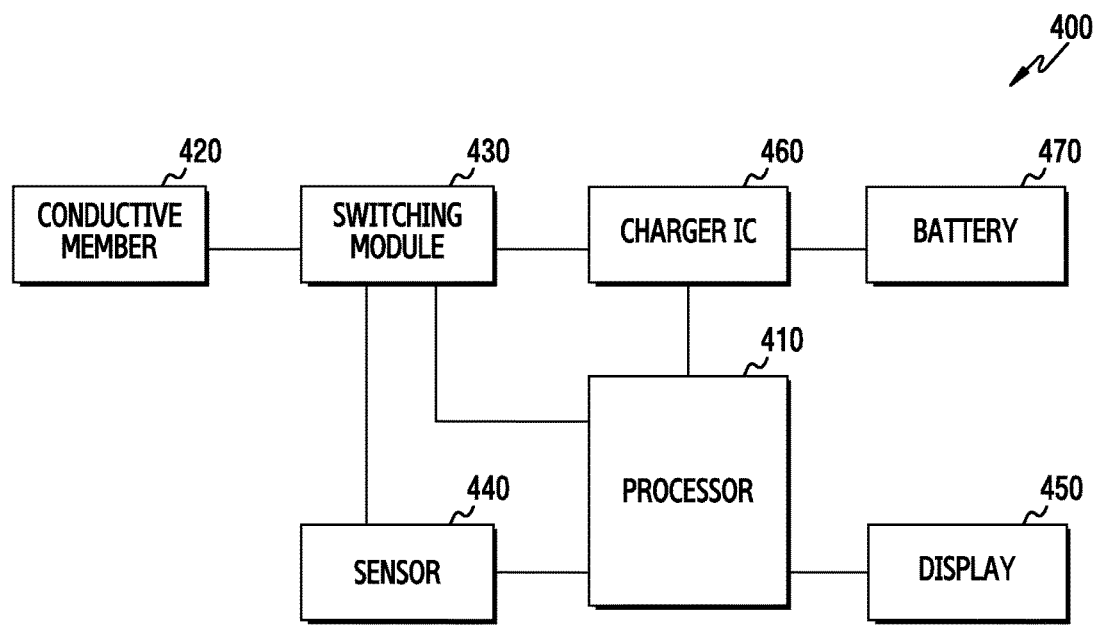
FIG. 4A is a block diagram of an electronic device for confirming whether a conductive member contacts a fluid or not according to various embodiments of the present disclosure.

FIG. 4A is a block diagram of an electronic device that can confirm whether or not a conductive member contacts a fluid according to various embodiments of the present disclosure. In the following description, the electronic device 400 may include all or a part of the electronic device 101 of FIG. 1 or the electronic device 201 of FIG. 2.

Referring now to FIG. 4A, the electronic device 400 may include a processor 410, a conductive member 420, a switching module 430, a sensor 440, a display 450, a charger IC 460, and a battery 470. The electronic device 400 may include at least one processor 410. For example, the processor 410 may include at least one of a central processing unit (CPU), an application processor (AP), and a communication processor (CP).

According to an embodiment, the processor 410 may collect the user's body-related information through the sensor 440. For example, when the electronic 400 is worn by the user, the processor 410 may activate the sensor 440 so as to acquire the user's body information. The processor 410 may acquire the user's body-related information based on the information provided from the activated sensor 440. Alternatively, the processor 410 may control the display 450 so as to display the user's body-related information. For example, the information provided from the activated sensor 440 may include at least one of a voltage signal, a current signal, and a resistance value.

According to an embodiment, when the processor 410 has detected occurrence of an event for confirming whether a fluid contact has occurred or not, the processor 410 may control the switching module 430 such that the sensor 440 and the conductive member 420 are connected. The processor 410 may determine whether the electronic device 400 or the conductive member 420 has contacted a fluid or not based on the resistance value caused by the conductive member 420, which has been provided from the sensor 440. For example, when the resistance value caused by the conductive member 420 is smaller than a reference resistance value, the processor 410 may determine that the electronic device 400 or the conductive member 420 has contacted a fluid. For example, the processor 410 may detect occurrence of an event for confirming whether a fluid contact occurs or not based on at least one of whether the electronic device 400 is detached or not, arrival of a period for confirming whether a fluid contact occurs or not, and selection of a fluid contact confirmation icon.

According to an embodiment, the processor 410 may deactivate the charging function of the electronic device 400 when a fluid contact of the electronic device 400 or the conductive member 420 is confirmed. For example, the processor 410 may control the switching module 430 such that the conductive member 420 (for example, a connector) and the charger IC 460 are not connected. For example, the processor 410 may control the switching module 430 such that the connection between the conductive member 420 and the sensor 440 is maintained. Alternatively, the processor 410 may control at least one of a vibration motor, an indicator (for example, LED), and a display 450 so as to output fluid contact information (for example, information indicating that charging is restricted).

According to an embodiment, when the processor 410 has deactivated the charging function due to a fluid contact of the electronic device 400, the processor 410 may again confirm whether the electronic device 400 or the conductive member 420 (for example, a connector) contacts a fluid or not through the sensor 440. For example, the processor 410 may control the sensor 440 so as to periodically confirm whether the electronic device 400 or the conductive member 420 is in contact with a fluid. When it is determined by the processor that the conductive member 420 has not contacted any fluid, the processor 410 may activate the charging function of the electronic device 400. For example, the processor 410 may control the switching module 430 such that the conductive member 420 and the charger IC 460 are connected. Alternatively, the processor 410 may control at least one of a vibration motor, an indicator (for example, LED), and a display 450 so as to output fluid contact release information (for example, information indicating that charging is possible).

According to an embodiment, the processor 410 may perform sensor correction (i.e. sensor adjustment), when a fluid contact of the electronic device 400 is confirmed, so as to correspond to the fluid contact. For example, the processor 410 may update the touch recognition value of the touch screen or the touch sensor lest erroneous touch recognition should be caused by the layer of water. For example, the touch recognition value may indicate a reference capacitance for determining a change in capacitance, which has been detected through the touch screen or the touch sensor, as a touch input. For example, the processor 410 may correct (i.e. adjust) the atmospheric pressure state determination parameter of the barometer sensor so as to correspond to the difference in atmospheric pressure between the inside and outside of water. For example, the processor 410 may correct (i.e. adjust) the white balance of the camera module so as to correspond to distortion of color sense occurring underwater.

According to an embodiment, the processor 410 may estimate the fluid contact range of the electronic device 400 based on the fluid contact time of the electronic device 400, when a fluid contact of the electronic device 400 has been confirmed. For example, the processor 410 may confirm whether the fluid contact time of the electronic device 400 exceeds the fluid contact time reference of the reference water penetration range (for example, IP67). The processor 410 may control the charger IC 460 so as to interrupt power supply of the electronic device 400 when the fluid contact time of the electronic device 400 exceeds the fluid contact time reference of the reference water penetration range.

The conductive member 420 may include an element of the electronic device 400, which is exposed to the outside of the electronic device 400 and has electric conductivity. For example, the conductive member 420 may include an antenna radiator, at least some pins of a connector, or an outer electrode. For example, the connector, which is a conductive member 420, may use at least two of a plurality of pins as GSR electrodes, for the purpose of charging or data transmission. For example, when the electronic device 400 is worn by the user, the conductive member 420 may be positioned on a surface of the electronic device 400, which contacts the user.

The switching module 430 may connect the conductive member 420 and the sensor 440 or the charger IC 460. For example, when occurrence of an event for confirming whether a fluid contact occurs or not is detected, the switching module 430 may connect the conductive member 420 and the sensor 440. When the charging function of the electronic device 400 has been activated, the switching module 430 may connect the conductive member 420 and the charger IC 460.

The sensor 440, when connected with the conductive member 420 by the switching module 430, may supply a micro current to a first pin of the conductive member 420, which has been set as an electrode (for example, a GSR electrode). For example, the micro current may indicate a current in the range of tens of nA-2 uA. For example, the sensor 440 may include a GSR sensor.

The sensor 440 may acquire a resistance value caused by the conductive member 420, based on a value of current received through a second pin of the conductive member 420, which has been set as an electrode. The sensor 440 may transfer the resistance value caused by the conductive member 420 to the processor 410. For example, the sensor 440 may acquire a resistance value, according to the external environment, as given in Table 1 below:

TABLE 1

|  | Normal condition (when not worn) | When water layer is formed (water penetration) | Skin resistance value (when worn) |
|---|---|---|---|
| Resistance value between terminals (Ω) | ∞ | 474 Ω | 12 MΩ |

The display 450 may display various pieces of content (e.g., text, images, videos, icons, symbols, etc.) to the user. For example, the display 450 may display the user's body-related information acquired through the sensor 440. For example, the display 450 may display fluid contact information or fluid contact release information on at least a part of the display area.

The charger IC 460 may control the charging/discharging of the battery 470. For example, when connected with the conductive member 420 through the switching module 430, the charger IC 460 may provide the battery 470 with external power, which has been provided through the conductive member 420. For example, the charger IC 460 may conduct a control such that power is provided from the battery 470 to elements of the electronic device 400. For example, the charger IC 460 may interrupt power supply to elements of the electronic device 400 when the processor 410 has determined that the fluid contact time of the electronic device 400 has exceeded the fluid contact time reference of the reference water penetration range.

The battery 470 may conduct charging using an external power supply and may supply power to an external device. For example, the battery 470 may include at least one cell.

According to various embodiments of the present disclosure, the electronic device may include other outer electrodes (for example, outer GSR electrode) than the conductive member 420, in order to collect the user's body-related information through the sensor 440. For example, when the electronic device 400 is worn by the user, the sensor 440 may acquire the user's body-related information (resistance value) through the outer electrodes. For example, when the processor 410 has detected occurrence of an event for confirming whether a fluid contact occurs or not, the sensor 440 may detect information (for example, resistance value) for confirming whether a fluid contact occurs or not through the outer electrodes. For example, when the processor 410 has detected occurrence of an event for confirming whether a fluid contact occurs or not, the sensor 440 may be connected to the electrodes of the conductive member 420. The sensor 440 may detect a resistance value for confirming whether a fluid contact occurs or not through the electrodes of the conductive member 420.

Figure 4B:
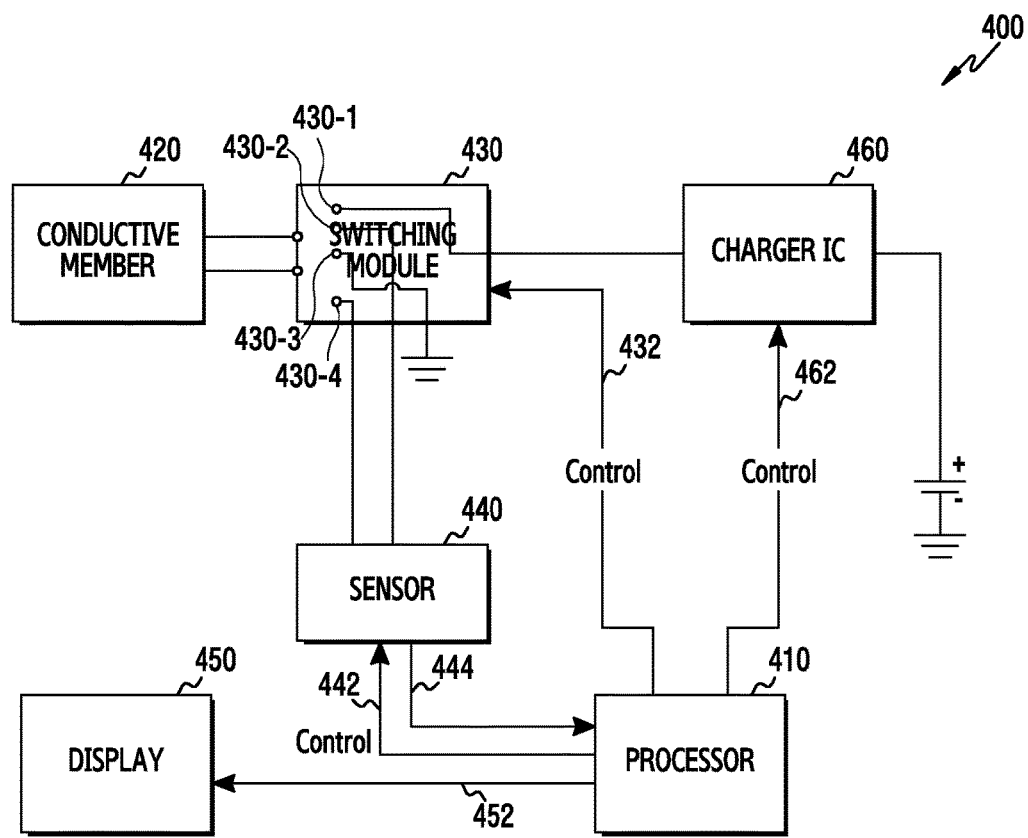
FIG. 4B is a circuit diagram of an electronic device for confirming whether a conductive member contacts a fluid or not according to various embodiments of the present disclosure.

FIG. 4B is a circuit diagram of an electronic device for confirming whether a conductive member contacts a fluid or not according to various embodiments of the present disclosure.

Referring now to FIG. 4B, the electronic device 400 may include a processor 410, a conductive member 420, a switching module 430, a sensor 440, a display 450, and a charger IC 460.

According to an embodiment, the processor 410 may transmit a control signal for activating or deactivating the sensor 440, through a first control path 442, to the sensor 440. For example, when the electronic device 400 is worn by the user, the processor 410 may transmit an activation request signal to the sensor 440 through the first control path 442, in order to acquire the user's body information. For example, the processor 410 may transmit an activation request signal to the sensor 440 through the first control path 442 in response to occurrence of an event for confirming whether a fluid contact occurs or not.

According to an embodiment, the processor 410 may acquire the user's body-related information based on information provided from the sensor 440 through a first data path 444. For example, the processor 410 may transmit the user's body-related information to the display 450 through a second data path 452. For example, the information provided from the activated sensor 440 may include at least one of a voltage signal, a current signal, and a resistance value.

According to an embodiment, the processor 410 may determine whether the electronic device 400 or the conductive member 420 contacts a fluid or not based on information provided from the sensor 440 through the first data path 444. For example, when the resistance value caused by the conductive member 420 is less than a reference resistance value, the processor 410 may determine that the electronic device 400 or the conductive member 420 has contacted a fluid.

According to an embodiment, the processor 410 may transmit a control signal for controlling connection of the switching module 430, through the second control path 452, to the switching module 430. For example, when the electronic device 400 is worn by the user, the processor 410 may transmit a control signal for connecting the conductive member 420 and the sensor 440, in order to acquire the user's body information, to the switching module 430 through the second control path 432. For example, the processor 410 may transmit a control signal for connecting the conductive member 420 and the sensor 440, in response to occurrence of an event for confirming whether a fluid contact occurs or not, to the switching module 430 through the second control path 432. For example, when a fluid contact of the electronic device 400 or the conductive member 420 is confirmed, the processor 410 may transmit a control signal for interrupting the connection between the conductive member 420 and the charger IC 460 to the switching module 430 through the second control path 432.

According to an embodiment, the processor 410 may transmit a control signal for interrupting power supply of the electronic device 400 to the charger IC 460 through a third control path 462 when the fluid contact time of the electronic device 400 exceeds the fluid contact time reference of the reference water penetration range. An artisan understands and appreciates that a number of control paths, and the entire arrangement as shown in FIG. 4B is provided for exemplary purposes.

According to an embodiment, when the charging function of the electronic device 400 is activated, the processor 410 may transmit a control signal for connecting the conductive member 420 and the charger IC 460 to the switching module 430 through the second control path 432.

According to an embodiment, the switching module 430 may connect the conductive member 420 and the sensor 440 or the charger IC 460 based on a control signal provided through the second control path 432. For example, when connecting the conductive member 420 and the sensor 440, the switching module 430 may connect the first and second paths of the conductive member 420 to the first and second paths 430-2 and 430-4 of the sensor 440, respectively. For example, when connecting the conductive member 420 and the charger IC 460, the switching module 430 may connect the first path of the conductive member 420 to the first path

430-1 of the charger IC 460 and connect the second path of the conductive member 420 to the ground.

According to an embodiment, when activated based on an activation request signal provided through the first control path 442, the sensor 440 may supply a micro current to the first path of the conductive member 420, which has been connected by the switching module 430. The sensor 440 may acquire a resistance value caused by the conductive member 420, based on a value of current received through the second path of the conductive member 420. The sensor 440 may transfer the resistance value caused by the conductive member 420 to the processor 410 through the first data path 444.

According to an embodiment, the display 450 may display various types of contents (for example, texts, images, videos, icons, or symbols) provided from the processor 410 through the second data path 452. For example, the display 450 may display the user's body-related information provided from the processor 410 through the second data path 452. For example, the display 450 may display fluid contact information or fluid contact release information, which has been provided from the processor 410 through the second data path 452.

According to an embodiment, when the charger IC 460 receives a control signal for interrupting power supply through the third control path 462, the charger IC 460 may interrupt power supply from the battery to elements of the electronic device 400.

According to various embodiments of the present disclosure, an electronic device may include: a housing; at least one sensor arranged in the housing; a coupling member connected to a part of the housing and configured to detachably couple the electronic device to a part of a body of a user; a conductive member arranged on a surface of the housing or on a surface of the coupling member and exposed to an outside while being electrically connectible to the at least one sensor; a processor electrically connected to the at least one sensor and the conductive member; and a memory electrically connected to the processor. The memory may store instructions that, when executed, causes the processor to acquire at least one item (e.g. piece, portion) of information related to the body of the user using the at least one sensor, to execute a first action based on the acquired information, to determine whether the conductive member has contacted a fluid or not using the at least one sensor, and to execute a second action at least partially based on the determination.

According to various embodiments of the disclosure, the instructions may cause the processor to measure/determine a resistance of an outer material, which has contacted the conductive member, using a current or voltage generated (e.g. output) from the at least one sensor and to determine whether the conductive member has been exposed to a fluid (for example, moisture) or not based on the measured resistance.

According to various embodiments of the disclosure, the instructions may cause the processor to measure a resistance of an outer material, which has contacted to the conductive member, using a current generated from the at least one sensor and to selectively perform acquisition of the at least one item of information and the determination based on the measured resistance.

According to various embodiments of the disclosure, the first action may include an operation that displays at least one item of information related to the body of the user on a display of the electronic device.

According to various embodiments of the disclosure, the second action may include at least one of an operation that deactivates a charging function of the electronic device, an operation that outputs fluid contact information, and an operation that corrects (i.e. adjusts) sensor information, when it is determined that the conductive member has been exposed to a fluid (for example, moisture). An artisan should understand and appreciate that such adjustment of the sensor information may also include at least of resetting or recalibrating the sensor. The term "correct" may include comparing the information with information in storage to determine there is a need to correct the sensor information. It is also within the scope of the disclosure that if there are multiple sensors and, for example one has a reading that is different beyond a predetermined threshold value, the output of that sensor may be corrected/adjusted to expected values or similar to the values output by other sensors in a multi-sensor environment.

According to various embodiments of the disclosure, a surface of the housing or a surface of the coupling member may include a surface that contacts the user when the user wears the electronic device.

According to various embodiments of the disclosure, the conductive member may include at least one of an antenna radiator, and an outer electrode.

According to various embodiments of the disclosure, the conductive member may include at least a part of the coupling member.

According to various embodiments the disclosure, the sensor may include a Galvanic Skin Reflex (GSR) sensor.

According to various embodiments of the disclosure, the electronic device may further include: a battery mounted in the housing, the battery comprising at least one cell; a charging module electrically connected to the battery; and a switching module electrically connected to the charging module, the sensor, and the conductive member. The instructions may cause the processor to connect the conductive member and the sensor through the switching module such that a current generated from the at least one sensor is supplied to the conductive member, to measure a resistance of an outer material, which has contacted the conductive member, using the current supplied to the conductive member, and to determine whether the conductive member has been exposed to a fluid (for example, moisture) or not based on the measured resistance.

According to various embodiments of the disclosure, the instructions may cause the processor to connect the conductive member and the sensor through the switching module when it is determined that the conductive member has been exposed to a fluid (for example, moisture).

According to various embodiments of the disclosure, the instructions may cause the processor to interrupt the connection between the conductive member and the charging module through the switching module when it is determined that the conductive member has been exposed to a fluid (for example, moisture).

According to various embodiments of the disclosure, the instructions may cause the processor to connect the conductive member and the charging module through the switching module when it is determined that the conductive member has not been exposed to a fluid (for example, moisture).

According to various embodiments disclosure, the instructions may cause the processor to detect a fluid contact time of the electronic device, when it is determined that the conductive member has been exposed to a fluid (for example, moisture), and to estimate a fluid contact range of the electronic device based on the fluid contact time.

According to various embodiments of the disclosure, the instructions may cause the processor to interrupt power supply of the electronic device based on the fluid contact range of the electronic device.

According to various embodiments of the disclosure, an electronic device may include: a housing; at least one sensor arranged in the housing; a coupling member connected to the housing and configured to detachably couple the electronic device to a part of a body of a user; a conductive member arranged on a surface of the housing or on a surface of the coupling member and exposed to an outside while being electrically connectible to the at least one sensor; a processor electrically connected to the at least one sensor and the conductive member; and a memory electrically connected to the processor. The memory may store instructions that, when executed, causes the processor to determine whether the conductive member has contacted a fluid or not using at least one sensor and to execute a second action at least partially based on the determination.

Figure 5:
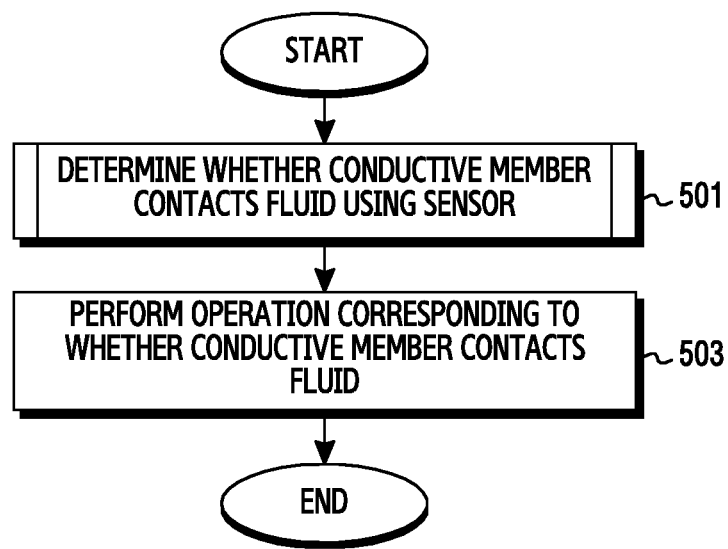
FIG. 5 is a flowchart for confirming whether an electronic device contacts a fluid or not according to various embodiments of the present disclosure.

FIG. 5 is a flowchart providing exemplary operations for confirming whether an electronic device contacts a fluid or not according to various embodiments of the present disclosure. Operations for determining whether a fluid contact occurs or not in connection with the electronic device 400 of FIG. 4 will now be described. The electronic device 101 or 201 of FIG. 1 or FIG. 2 may function in the same or similar manner as the electronic device 400.

Referring now to FIG. 5, in operation 501, the electronic device may determine whether the conductive member contacts a fluid using a sensor (for example, GSR sensor). For example, the processor 410 may determine whether the conductive member contacts a fluid or not based on information (for example, resistance value) regarding the conductive member (for example, pin of the conductive member 420) acquired through the sensor 440. For example, the processor 410 may determine that the conductive member has contacted a fluid when the resistance value caused by the conductive member is less than the reference resistance value. (Throughout the disclosure, less than or equal to the reference value may also be the basis for determining contact)

In operation 503, the electronic device may perform an operation corresponding to whether the conductive member has contacted a fluid. For example, when the processor 410 has confirmed a fluid contact of the conductive member (for example, conductive member 420), the processor 410 may deactivate the charging function of the electronic device 400. When it is confirmed that the conductive member has not contacted any fluid, the processor 410 may activate the charging function of the electronic device 400. For example, when the processor 410 has confirmed a fluid contact of the conductive member (for example, conductive member 420), the processor 410 may correct sensor information, which has been acquired through at least one sensor of the electronic device 400, so as to correspond to the fluid contact. For example, the processor 410 may correct touch recognition information of the touch screen or the touch sensor lest erroneous touch recognition should be caused by the layer of water. For example, the processor 410 may correct the measurement value of the barometer sensor so as to correspond to the difference in atmospheric pressure between the inside and outside of water. For example, the processor 410 may correct the white balance of the camera module so as to correspond to distortion of color sense occurring underwater.

Figure 6:
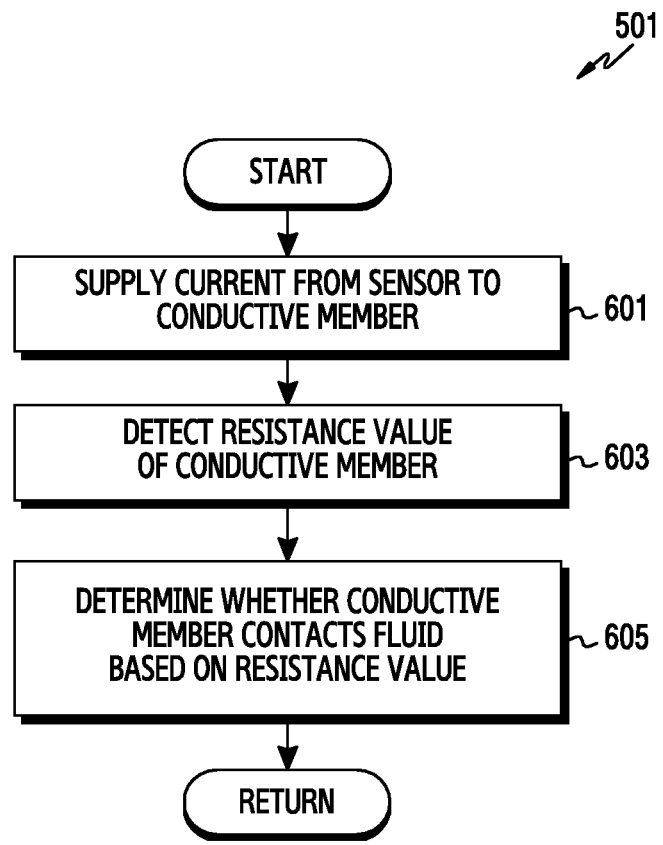
FIG. 6 is a flowchart for determining whether a contact with a fluid occurs or not, based on a resistance value of a conductive member, in connection with an electronic device according to various embodiments of the present disclosure.

FIG. 6 is a flowchart providing exemplary operation for determining whether a contact with a fluid occurs or not, based on a resistance value of a conductive member, in connection with an electronic device according to various embodiments of the present disclosure. Operations for determining whether a fluid contact of a conductive member occurs or not by the electronic device 400 of FIG. 4, as operation 501 of FIG. 5, will now be described. The electronic device 101 or 201 of FIG. 1 or FIG. 2 may function in the same or similar manner as the electronic device 400.

Referring now to FIG. 6, in operation 601, the electronic device may supply a current to the conductive member through a sensor (for example, GSR sensor) in order to determine whether the conductive member contacts a fluid or not. For example, the processor 410 may connect the conductive member 420 and the sensor 440 through the switching module 430. The sensor 440 may supply a micro current to the first pin, which has been set as an electrode among pins of the conductive member 420. For example, the micro current may indicate a current having a size included in the range of tens of nA-2 uA.

In operation 603, the electronic device may detect a resistance value between electrodes of the conductive member. For example, the sensor 440 may calculate a resistance value between electrodes of the conductive member 420 based on a current received from a second pin, which has been set as an electrode among pins of the conductive member 420.

In operation 605, the electronic device may determine whether the conductive member has contacted a fluid based on the resistance value between electrodes of the conductive member. For example, the processor 410 may compare the resistance value between pins of the conductive member 420, which has been provided from the sensor 440, with the reference resistance value. For example, when the resistance value between pins of the conductive member 420 is smaller than the reference resistance value, the processor 410 may determine that the conductive member 420 or the electronic device 400 has contacted a fluid.

Figure 7:
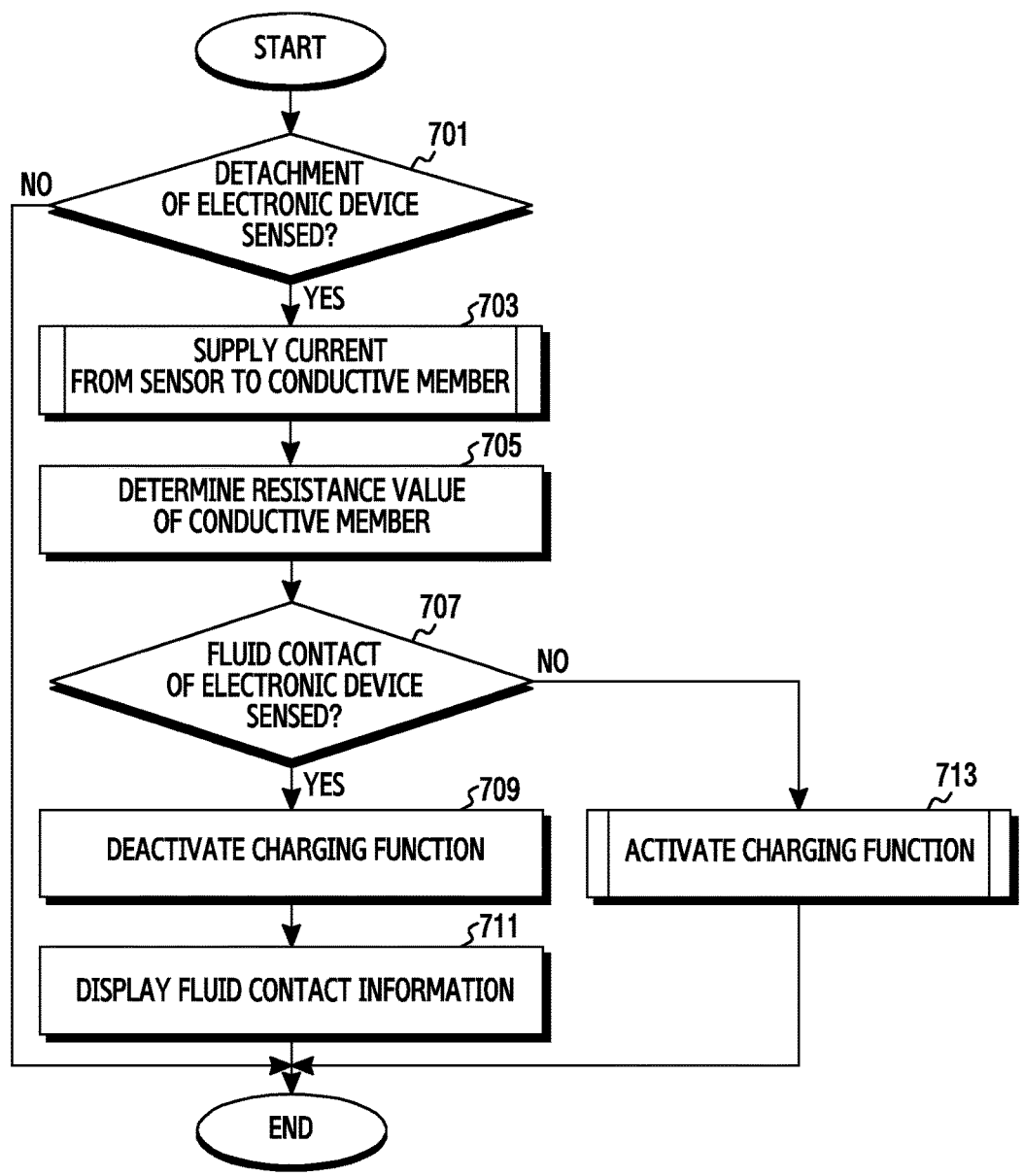
FIG. 7 is a flowchart for controlling a charging function so as to correspond to whether a contact with a fluid occurs or not in connection with an electronic device according to various embodiments of the present disclosure.
Figure 11:
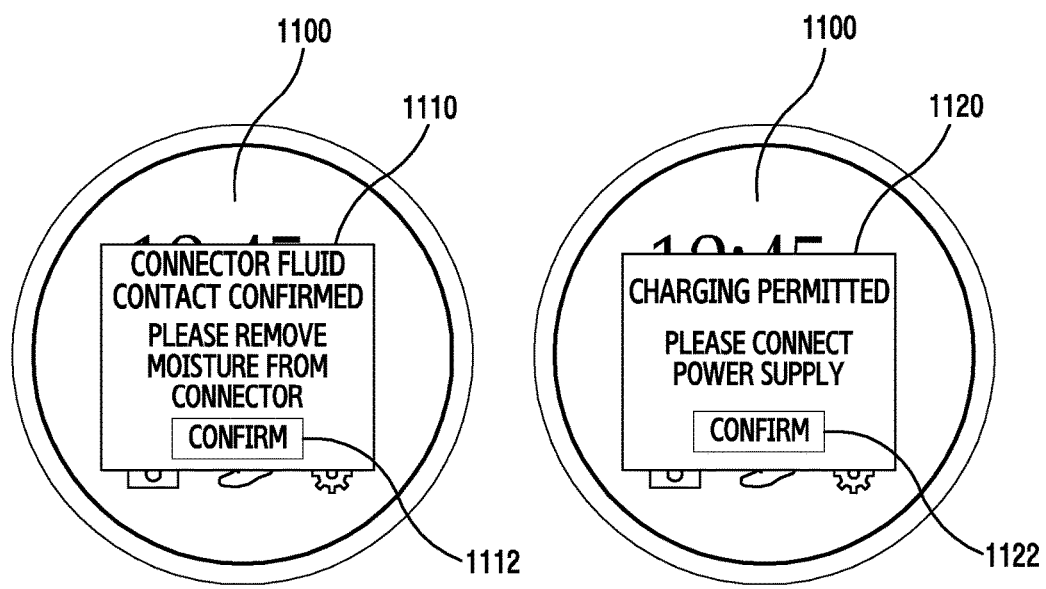
FIG. 11A and FIG. 11B illustrate screen configurations in connection with fluid contact-related information displayed on an electronic device according to various embodiments of the present disclosure.

FIG. 7 is a flowchart providing exemplary operations for controlling a charging function so as to correspond to whether a contact with a fluid occurs or not in connection with an electronic device according to various embodiments of the present disclosure. Operations for controlling the charging function by the electronic device 400 of FIG. 4 will now be described with reference to the screen configuration of FIG. 11. The electronic device 101 or 201 of FIG. 1 or FIG. 2 may function in the same manner as the electronic device 400.

Referring now to FIG. 7, in operation 701, the electronic device may confirm whether the electronic device, which has been worn on the user's body, is detached or not. For example, the processor 410 may confirm whether the electronic device 400 is worn by the user or not using at least one of the proximity sensor, the motion detection sensor, the temperature sensor, the GSR sensor, and the heartbeat sensor of the electronic device 400. For example, the proximity sensor, the temperature sensor, or the heartbeat sensor may be arranged on a surface of the housing, at least one or more of which contacts the user.

In operation 703, when the electronic device has sensed detachment of the corresponding electronic device from the user's body, the electronic device may supply a current to an electrode (for example, GSR electrode) of the conductive member through a sensor (for example, GSR sensor). For example, when the processor 410 has sensed detachment of the electronic device 400, the processor 410 may control the switching module 430 such that the conductive member 420 and the sensor 440 are connected. The sensor 440 may supply a current to the first pin of the conductive member 420, which has been connected by the switching module 430. For example, the first pin of the conductive member 420 may indicate one of a plurality of pins included in the conductive member 420, which has been set as an electrode.

In operation 705, the electronic device may detect a resistance value between electrodes of the conductive member. For example, the sensor 440 may calculate the resistance value between pins of the conductive member 420 based on the size of a current supplied from the second pin of the conductive member 420 and based on the size of a current supplied to the first pin thereof. For example, the second pin of the conductive member 420 may indicate one of a plurality of pins included in the conductive member 420, which has been set as an electrode. The first and second pins of the conductive member 420 may be set as pins that are not adjacent to each other.

In operation 707, the electronic device may determine whether at least a part of the elements of the electronic device (for example, conductive member) has contacted a fluid or not, based on a resistance value between electrodes of the conductive member. For example, when the resistance value between pins of the conductive member 420 is smaller than the reference resistance value, the processor 410 may determine that the conductive member 420 is penetrated by water.

In operation 709, the electronic device may deactivate the charging function of the electronic device when it is determined that at least a part of the elements of the electronic device (for example, conductive member) has contacted a fluid. For example, the processor 410 may interrupt the connection between the conductive member 420 and the charger IC 460 through the switching member 430, thereby deactivating the charging function, when it is determined that the conductive member 420 has contacted a fluid. In this case, no electric field is formed in the conductive member 420 by the external power supply, thereby preventing corrosion.

In operation 711, the electronic device may display fluid contact information on the display such that the user can check information indicating deactivation of charging due to a fluid contact. For example, the processor 410 may control the display 450 so as to display information 1110, which indicates that the conductive member 420 (for example, connector) has contacted a fluid (for example, information indicating that charging is restricted), on at least a part of the display area 1100, as illustrated in FIG. 11A. When the processor 410 detects an input of the "Confirm" button 1112 included in the fluid contact information 1110, the processor 410 may hide or remove the fluid contact information displayed on the display 450.

In operation 713, the electronic device may activate the charging function of the electronic device when it is determined that at least a part of the elements of the electronic device (for example, conductive member) has not contacted any fluid. For example, the processor 410 may connect the conductive member 420 and the charger IC 460 through the switching member 430, thereby activating the charging function, when it is determined that the conductive member 420 has not contacted any fluid.

According to an embodiment of the present disclosure, the electronic device 400 may output fluid contact information using at least one of the vibration motor, the indicator, the speaker, and the display 450. For example, the electronic device 400 may generate vibration of a pattern corresponding to the fluid contact information using the vibration motor. For example, the electronic device 400 may change the color or blinking pattern of the LED indicator and output the same to the fluid contact information. For example, the electronic device 400 may output a fluid contact warning sound through the speaker.

Figure 8:
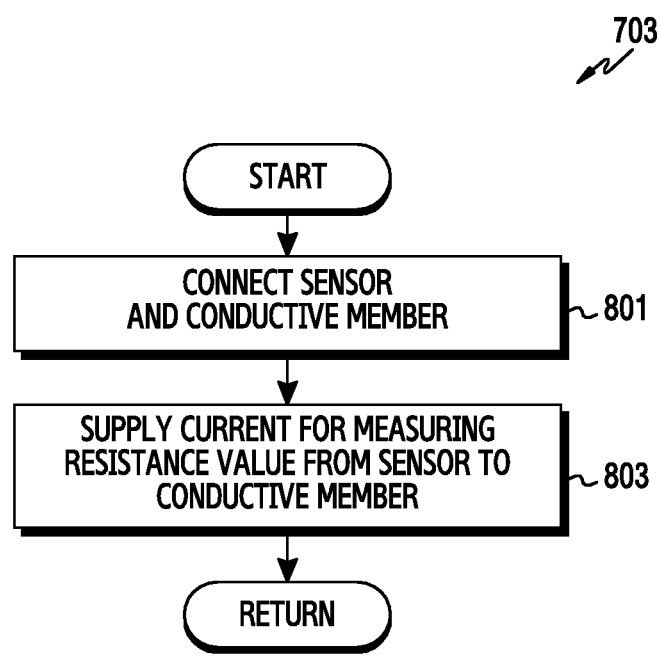
FIG. 8 is a flowchart for supplying a current to a conductive member in connection with an electronic device according to various embodiments of the present disclosure.

FIG. 8 is a flowchart providing exemplary operations for supplying a current to a conductive member in connection with an electronic device according to various embodiments of the present disclosure. Operations for supplying a current to a conductive member by the electronic device 400 of FIG. 4, as operation 703 of FIG. 7, will now be described. The electronic device 101 or 201 of FIG. 1 or FIG. 2 may function in the same manner as the electronic device 400.

Referring now to FIG. 8, in operation 801, when the electronic device has sensed detachment of the corresponding electronic device from the user's body, the electronic device may connect a sensor (for example, GSR sensor) and a conductive member. For example, when detachment of the electronic device 400 is sensed in operation 701 of FIG. 7, the processor 410 may generate a current transmission path between the conductive member 420 and the sensor 440 through the switching module 430.

In operation 803, the electronic device may supply a current to an electrode (for example, GSR electrode) of the conductive member through the sensor, in order to measure a resistance value caused by the conductive member. For example, the sensor 440 may supply a current to the first pin of the conductive member 420 through a current transmission path generated by the switching module 430. For example, the first pin of the conductive member 420 may indicate one of a plurality of pins included in the conductive member 420, which has been set as an electrode.

Figure 9:
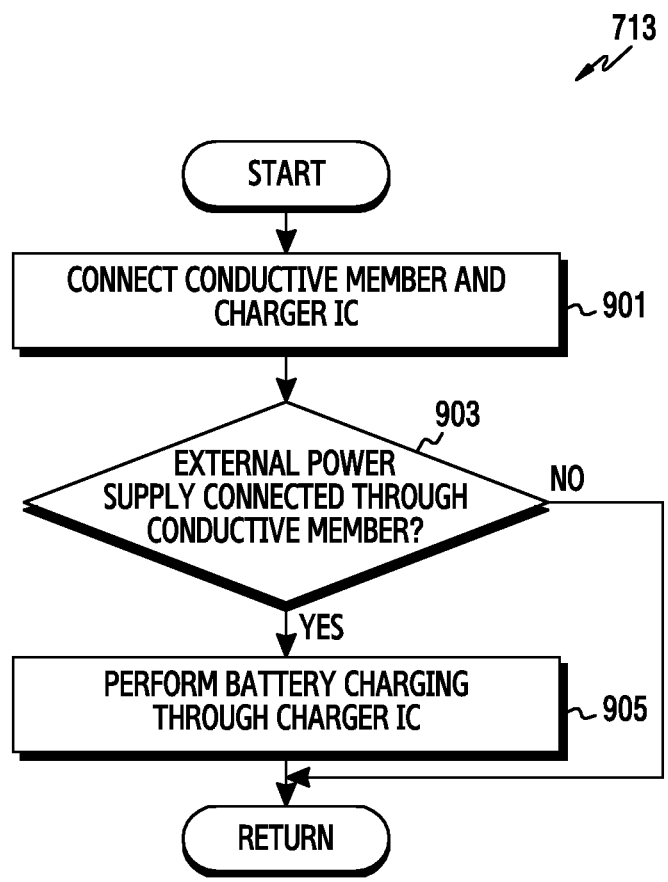
FIG. 9 is a flowchart for conducting charging in connection with an electronic device according to various embodiments of the present disclosure.

FIG. 9 is a flowchart providing exemplary operations for conducting charging in connection with an electronic device according to various embodiments of the present disclosure. Operations for performing charging by the electronic device 400 of FIG. 4, as operation 713 of FIG. 7, will now be described. The electronic device 101 or 201 of FIG. 1 or FIG. 2 may function in the same manner as the electronic device 400.

Referring now to FIG. 9, in operation 901, the electronic device may connect a conductive member and a charging module when it is determined that at least a part of the elements of the electronic device (for example, conductive member) has not contacted any fluid. For example, the processor 410 may control the switching module 430 such that the conductive member 420 and the charger IC 460 are connected, when it is determined that the conductive member 420 has not contacted any fluid, in operation 707 of FIG. 7.

In operation 903, the electronic device may confirm whether an external power supply is connected through the conductive member or not. For example, the processor 410 may confirm whether an external power supply has been connected or not, based on an input value (H (high) or L (low)) of at least one pin (for example, GND pin) among a plurality of pins included in the conductive member 420. For example, the processor 410 may confirm whether an external power supply is connected or not through an external power supply confirmation module.

In operation 905, when an external power supply is connected to the conductive member, the electronic device may charge the battery of the electronic device using the external power supply. For example, the electronic device 400 may use the charger IC 460 to charge the battery 470 using external power provided through the conductive member 420.

Figure 10:
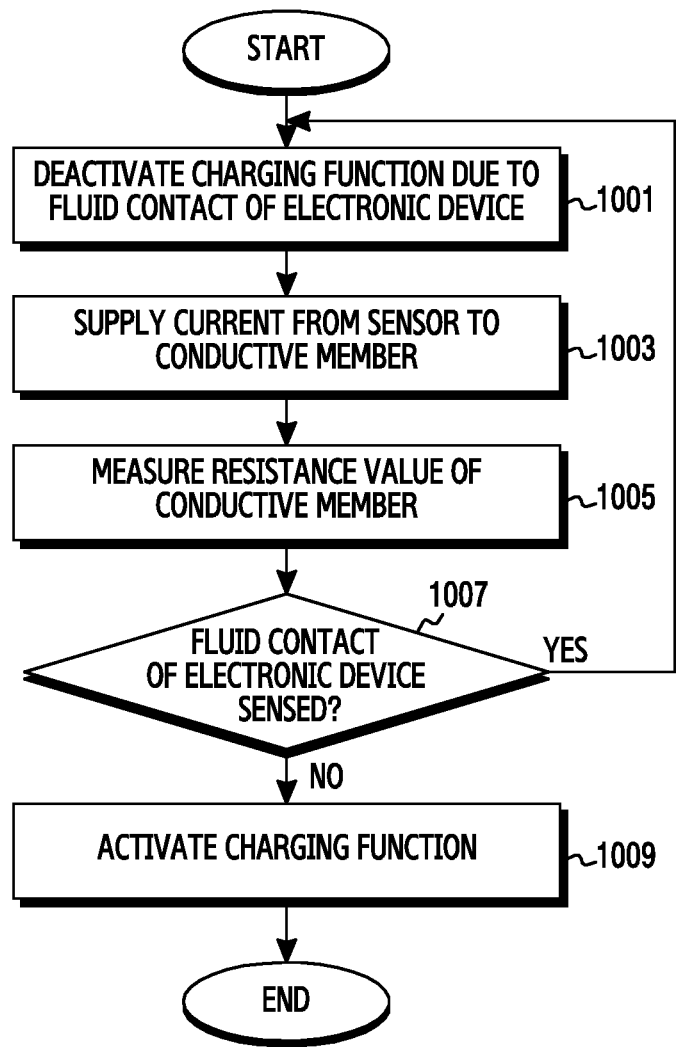
FIG. 10 is a flowchart for activating a charging function in connection with an electronic device according to various embodiments of the present disclosure.

FIG. 10 is a flowchart providing exemplary operations for activating a charging function in connection with an electronic device according to various embodiments of the present disclosure. Operations for activating the charging function by the electronic device 400 of FIG. 4 will now be described. The electronic device 101 or 201 of FIG. 1 or FIG. 2 may function in the same or similar manner as the electronic device 400.

Referring now to FIG. 10, in operation 1001, the electronic device may deactivate the charging function of the electronic device when a fluid contact of the electronic device is confirmed. For example, as in operations 703 to 709 of FIG. 7, when the processor 410 has confirmed a fluid contact in connection with at least a part (for example, conductive member 420) of elements of the electronic device 400, the processor 410 may control the switching module 430 such that the conductive member 420 and the charger IC 460 are not connected. For example, the switching module 430 may maintain the state of connection between the conductive member 420 and the sensor 440 in order to confirm whether the electric device contacts a fluid or not.

In operation 1003, the electronic device may supply a current to an electrode of the conductive member through a sensor in order to confirm again whether the electronic device contacts a fluid or not. For example, the sensor 440 may supply a micro current to an electrode of the conductive member 420, which has been connected by the switching module 430. For example, the electrode of the conductive member 420 may be set as one of a plurality of pins included in the conductive member 420.

In operation 1005, the electronic device may detect a resistance value between electrodes of the conductive member in order to determine whether the electronic device contacts a fluid or not. For example, the sensor 440 may calculate a resistance value between electrodes of the conductive member 420 based on the size of a current supplied to an electrode of the conductive member 420 and based on the size of a current received through another electrode thereof. For example, another electrode of the conductive member 420 may be set as another pin, which is not adjacent to the pin set as an electrode, among a plurality of pins included in the conductive member 420.

In operation 1007, the electronic device may determine whether the electronic device has contacted a fluid or not based on the resistance value between the electrodes of the conductive member. For example, when the resistance value between GSR electrodes of the conductive member 420 is smaller than the reference resistance value, the processor 410 may determine that the conductive member 420 has contacted a fluid.

The electronic device may maintain the state of deactivation of the charging function in operation 1001 when it is determined that the electronic device has contacted a fluid.

In operation 1009, the electronic device may activate the charging function of the electronic device when it is determined that the electronic device has not contacted any fluid. For example, the processor 410 may connect the conductive member 420 and the charger IC 460 through the switching member 430, thereby activating the charging function, when it is determined that the fluid contact of the conductive member 420, which has contacted a fluid, has been released.

According to an embodiment of the present disclosure, the electronic device 400 may output fluid contact release information using at least one of the vibration motor, the indicator, the speaker, and the display 450. For example, the electronic device 400 may generate vibration of a pattern corresponding to the fluid contact release information using the vibration motor. For example, the electronic device 400 may change the color or blinking pattern of the LED indicator and output the same to the fluid contact release information. For example, the electronic device 400 may output a fluid contact release sound through the speaker. For example, the electronic device 400 may control the display 450 so as to display information 1120, which indicates that the fluid contact of the conductive member 420 (for example, connector) has been released (for example, information indicating that charging is possible), on at least a part of the display area 1100, as illustrated in FIG. 11B. When the electronic device 400 detects an input of the "Confirm" button 1122 included in the fluid contact release information 1120, the electronic device may hide or remove the fluid contact release information displayed on the display 450.

Figure 12:
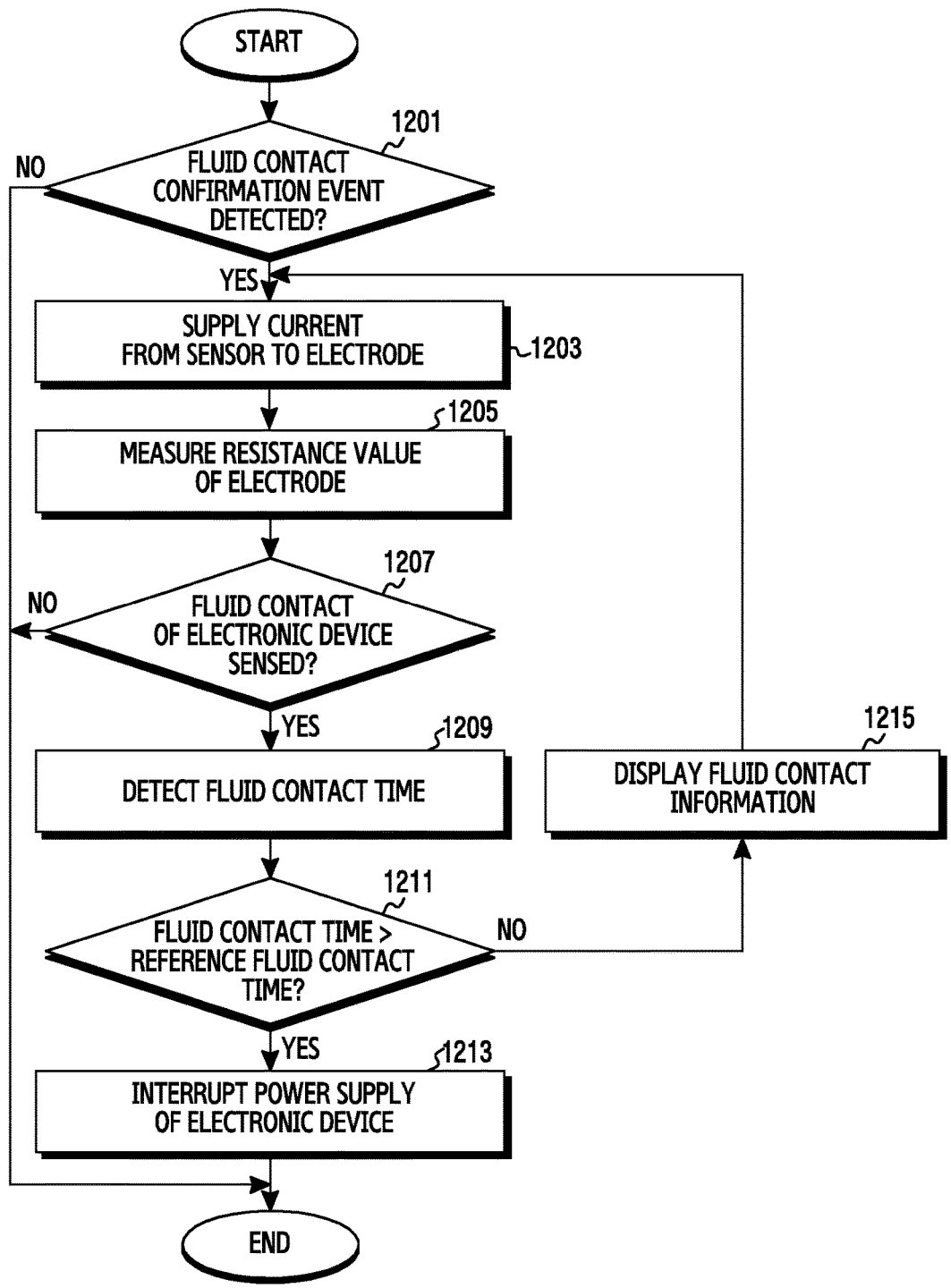
FIG. 12 is a flowchart for estimating a fluid contact range in connection with an electronic device according to various embodiments of the present disclosure.

FIG. 12 is a flowchart providing exemplary operations for estimating a fluid contact range in connection with an electronic device according to various embodiments of the present disclosure. Operations for determining a fluid contact range by the electronic device 400 of FIG. 4 will now be described. The electronic device 101 or 201 of FIG. 1 or FIG. 2 may function in the same manner as the electronic device 400.

Referring now to FIG. 12, in operation 1201, the electronic device may confirm occurrence of an event for confirming whether the electronic device contacts a fluid or not. For example, the processor 410 may confirm whether the electronic device 400, which has been worn by the user, is detached or not. For example, the processor 410 may confirm whether a period for confirming whether a fluid contact occurs or not has arrived or not. For example, the processor 410 may confirm whether selection of an icon for confirming whether a fluid contact occurs or not is detected or not.

In operation 1203, the electronic device may supply a current to an electrode through a sensor (for example, GSR sensor) when occurrence of an event for confirming whether the electronic device contacts a fluid or not has been detected. For example, when the sensor 440 and the electrode are not connected, the processor 410 may connect the sensor 440 and the electrode in response to the occurrence of an event for confirming whether the electronic device contacts a fluid or not. The sensor 440 may supply a micro current to the first electrode. For example, the electrode may include a conductive member, such as an antenna radiator, a pin of the conductive member 420, or an outer electrode.

In operation 1205, the electronic device may detect a resistance value between electrodes. For example, the sensor 440 may calculate the resistance value between electrodes based on the size of a current received from the second electrode.

In operation 1207, the electronic device may determine whether the electronic device has contacted a fluid or not based on the resistance value between electrodes. For example, the processor 410 may confirm whether the resistance value between electrodes (for example, pins of the conductive member 420), which has been provided from the sensor 440, is smaller than the reference resistance value or not. The processor 410 may determine that the electronic device 400 has contacted a fluid when the resistance value between electrodes is smaller than the reference resistance value.

In operation 1209, the electronic device may confirm the fluid contact time of the electronic device when it is determined that the electronic device has contacted a fluid. For example, when the electronic device has contacted a fluid, the processor 410 may periodically confirm whether the electronic device contacts a fluid or not. The processor 410 may estimate the fluid contact time of the electronic device 400 based on the confirmed number of consecutive fluid contacts of the electronic device 400.

In operation 1211, the electronic device may confirm whether the fluid contact time of the electronic device exceeds the reference fluid contact time or not. For example, the reference fluid contact time may indicate a reference time (about thirty minutes), which is defined by a specification (for example, IP67) related to fluid contact of an electronic device, and which is used to confirm that the electronic device is not penetrated by water in an underwater environment.

In operation 1213, the electronic device may interrupt power supply of the electronic device when the fluid contact time of the electronic device exceeds the reference fluid contact time. For example, when the fluid contact time of the electronic device exceeds the reference fluid contact time (for example, thirty minutes), the processor 410 may control the charger IC 460 such that power is not supplied from the battery 470 to elements of the electronic device.

In operation 1215, the electronic device may display fluid contact information or an indication such as a flashing light, colors, etc., when the fluid contact time of the electronic device is equal to or less than the reference fluid contact time. For example, the processor 410 may control the display 450 so as to display fluid contact information 1110 as in FIG. 11A.

When the fluid contact confirmation period arrives, the electronic device may supply a current to an electrode through a sensor in operation 1203. When it is determined that the electronic device 400 has contacted a fluid, the processor 410 may periodically confirm whether the electronic device 400 contacts a fluid or not. For example, the processor 410 may conduct a control such that a current is periodically supplied to an electrode through the sensor 440.

Figure 13:
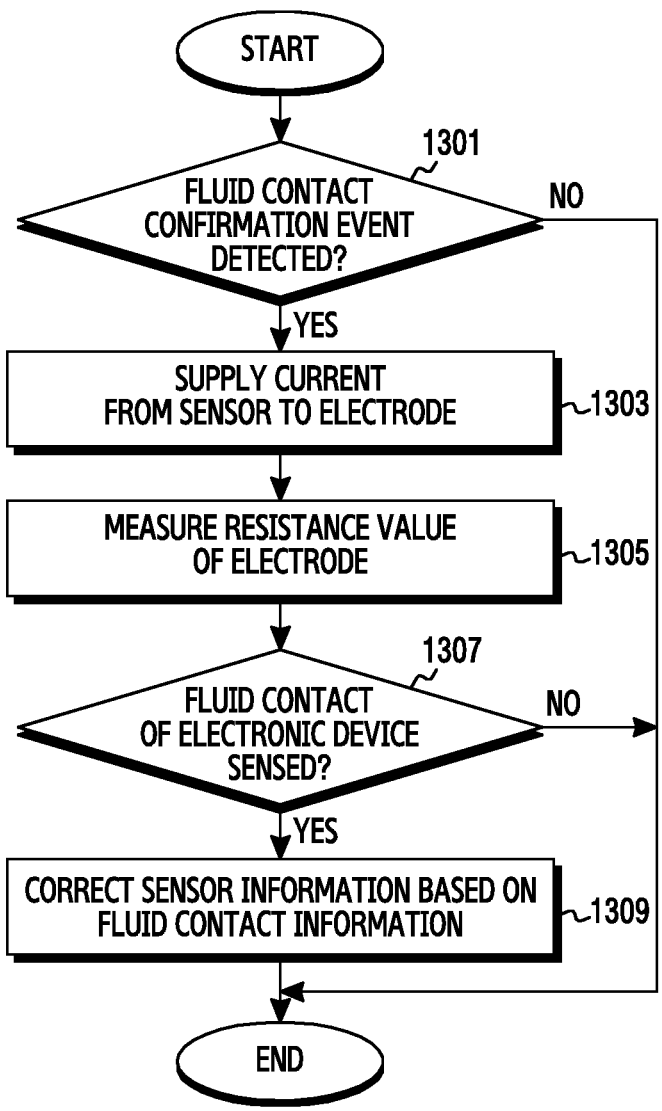
FIG. 13 is a flowchart for correcting sensor information so as to correspond to fluid contact information in connection with an electronic device according to various embodiments of the present disclosure.

FIG. 13 is a flowchart providing exemplary operation for correcting sensor information so as to correspond to fluid contact information in connection with an electronic device according to various embodiments of the present disclosure. Operations for correcting sensor information by the electronic device 400 of FIG. 4 will now be described. The electronic device 101 or 201 of FIG. 1 or FIG. 2 may function in the same manner as the electronic device 400.

Referring now to FIG. 13, in operation 1301, the electronic device may confirm occurrence of an event for confirming whether the electronic device contacts a fluid or not. For example, the processor 410 may confirm occurrence of an event for confirming whether a fluid contact occurs or not, based on at least one of whether the electronic device 400 is detached or not, arrival of a period for confirming whether a fluid contact occurs or not, and selection of an icon for confirming whether a fluid contact occurs or not.

In operation 1303, the electronic device may supply a current to an electrode through a sensor (for example, GSR sensor) when occurrence of an event for confirming whether the electronic device contacts a fluid or not has been detected. For example, when a pin of the conductive member 420 has been set as an electrode, the processor 410 may connect the sensor 440 and the electrode (at least a part of the conductive member 420) through the switching module 430. The sensor 440 may supply a micro current to the first electrode among electrodes included in the conductive member 420.

In operation 1305, the electronic device may detect a resistance value between electrodes through a sensor. For example, the sensor 440 may calculate the resistance value between electrodes based on the size of a current, which has been received from the second electrode among electrodes included in the conductive member 420, and based on the size of power supplied to the first electrode.

In operation 1307, the electronic device may determine whether the electronic device has contacted a fluid or not based on the resistance value between electrodes. For example, the processor 410 may confirm whether the resistance value between electrodes (for example, pins of the conductive member 420), which has been provided from the sensor 440, is smaller than the reference resistance value or not. The processor 410 may determine that the electronic device 400 or the conductive member 420 has contacted a fluid when the resistance value between GSR electrodes is smaller than the reference resistance value.

In operation 1309, the electronic device may correct sensor information so as to correspond to the fluid contact of the electronic device when it is determined that the electronic device has contacted a fluid. For example, when a fluid contact of the electronic device 400 has been confirmed, the processor 410 may correct the touch recognition information of the touch screen or the touch sensor lest the layer of water should cause erroneous touch recognition. For example, when a fluid contact of the electronic device 400 has been confirmed, the processor 410 may correct information regarding the atmospheric pressure state of the electronic device 400, which has been measured through the barometer sensor, so as to correspond to the difference in atmospheric pressure between the inside and outside of water. For example, when a fluid contact of the electronic device 400 has been confirmed, the processor 410 may correct the white balance of the camera module so as to correspond to the distortion of color sense occurring underwater. Alternatively, when it is determined that the fluid contact of the electronic device 400 has been released, the processor 410 may correct sensor information again so as to correspond to the release of fluid contact of the electronic device 400. Other embodiments may exist.

Figure 14:
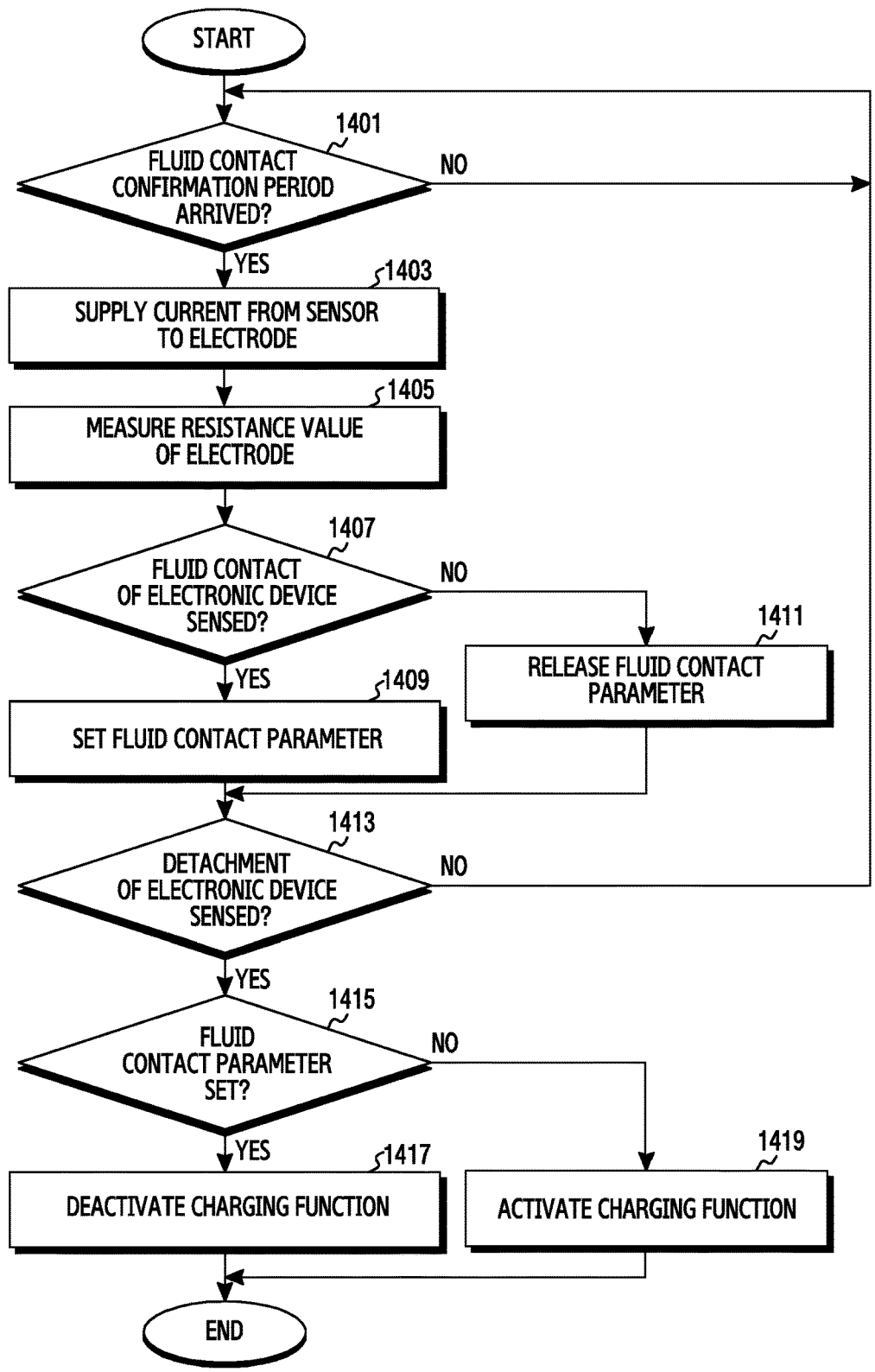
FIG. 14 is a flowchart for deactivating a charging function, when a contact with a fluid is sensed, in connection with an electronic device according to various embodiments of the present disclosure.

FIG. 14 is a flowchart providing exemplary operation for deactivating a charging function, when a contact with a fluid is sensed, in connection with an electronic device according to various embodiments of the present disclosure. Operations for deactivating the charging function by the electronic device 400 of FIG. 4 will now be described. The electronic device 101 or 201 of FIG. 1 or FIG. 2 may function in the same or similar manner as the electronic device 400.

Referring now to FIG. 14, in operation 1401, the electronic device may confirm arrival of a period for confirming whether the electronic device, which has been worn by the user, contacts a fluid or not. For example, when the electronic device 400 has been worn by the user, the processor 410 may confirm arrival of a period for confirming whether the conductive member 420 contacts a fluid or not. For example, the conductive member 420 may include a Pogo pin (for example, spring pin). When the electronic device 400 is worn by the user, the conductive member 420 may be positioned on a surface of the electronic device 400, which contacts the user.

In operation 1403, the electronic device may supply a current to an electrode through a sensor (for example, GSR sensor) when the period for confirming whether the electronic device contacts a fluid or not has arrived. For example, when the conductive member 420 for confirming whether a fluid contact occurs or not and the sensor 440 are not connected, the processor 410 may connect the sensor 440 and the conductive member 420 through the switching module 430. The sensor 440 may supply a micro current to the first electrode of the conductive member 420.

In operation 1405, the electronic device may detect a resistance value between electrodes through a sensor. For example, the sensor 440 may detect the resistance value between electrodes based on the size of power, which has been supplied to the first electrode of the conductive member 420, and based on the size of a current received from the second electrode.

In operation 1407, the electronic device may determine whether at least a part/portion of elements of the electronic device has contacted a fluid or not based on the resistance value between electrodes. For example, the processor 410 may confirm whether the resistance value between electrodes of the conductive member 420, which has been provided from the sensor 440, exceeds the reference resistance value or not. The processor 410 may determine that the conductive member 400 has contacted a fluid when the resistance value between electrodes exceeds the reference resistance value.

In operation 1409, the electronic device may set a fluid contact parameter when it is determined that at least a part of elements of the electronic device has contacted a fluid. For example, when it is determined that the conductive member 420 has contacted a fluid, the processor 410 may set the fluid contact parameter value for indicating whether the conductive member 420 has contacted a fluid or not as "true" (for example, 1).

In operation 1411, the electronic device may release a fluid contact parameter when it is determined that at least a part of elements of the electronic device has not contacted any fluid. For example, when it is determined that the conductive member 420 has not contacted any fluid, the processor 410 may set the fluid contact parameter value for indicating whether the conductive member 420 has contacted a fluid or not as "false" (for example, 0).

In operation 1413, the electronic device may confirm whether the electronic device, which has been worn on the user's body, is detached or not. For example, the processor 410 may confirm whether the electronic device 400 is detached or not using at least one of the proximity sensor, the motion detection sensor, the temperature sensor, the GSR sensor, and the heartbeat sensor of the electronic device 400.

When the electronic device is worn on the user's body, the electronic device may confirm whether the fluid contact confirmation period arrives or not in operation 1401.

In operation 1415, when the electronic device has sensed detachment of the electronic device from the user's body, the electronic device may confirm whether a fluid contact parameter of the electronic device has been set or not. For example, the processor 410 may confirm whether the fluid contact parameter value for indicating whether the conductive member 420 contacts a fluid or not is set as "true" or not. For example, when the fluid contact parameter value has been set as "true", the processor 410 may determine that the fluid contact parameter of the electronic device has been set. When the fluid contact parameter value has been set as "false", the processor 410 may determine that the fluid contact parameter of the electronic device has been released.

In operation 1417, when the fluid contact parameter of the electronic device has been set, the electronic device may determine that at least a part of elements of the electronic device (for example, conductive member) has contacted a fluid and deactivate the charging function of the electronic device. For example, the processor 410 may control the switching module 430 such that the conductive member 420 and the charger IC 460 are not connected.

In operation 1419, when the fluid contact parameter of the electronic device has been released, the electronic device may determine that the electronic device has not contacted any fluid and activate the charging function of the electronic device. For example, the processor 410 may control the switching module 430 such that the conductive member 420 and the charger IC 460 are connected, in order to activate the charging function.

According to an embodiment of the present disclosure, the electronic device may determine the user's exercise time based on whether the electronic device has contacted a fluid or not. For example, the electronic device may consider a point of time, at which a fluid contact of the electronic device has been confirmed, as the point of time at which the user has entered water for swimming, and thereby detect the user's swimming time. The electronic device may estimate the user's exercise state information (for example, amount of exercise, amount of consumed calories) based on the user's swimming time.

According to various embodiments of the disclosure, a method for operating an electronic device may include the operations of: acquiring at least one item of information related to a body of a user using at least one sensor; executing a first action based on the acquired information; determining whether a conductive member has contacted a fluid or not using the at least one sensor; and executing a second action at least partially based on the determination. The conductive member may be exposed to an outside while being electrically connectible to the at least one sensor.

According to various embodiments of the disclosure, the operation of determining whether a conductive member has contacted a fluid or not may include the operations of: measuring a resistance of an outer material, which has contacted the conductive member, using a current generated from the at least one sensor; and determining whether the conductive member has been exposed to a fluid (for example, moisture) or not based on the measured resistance.

According to various embodiments of the disclosure, the operation of determining whether a conductive member has contacted a fluid or not may include the operations of: connecting the conductive member and the sensor; supplying the conductive member with a current generated from the at least one sensor; measuring a resistance of an outer material, which has contacted the conductive member, using the current supplied to the conductive member; and determining whether the conductive member has been exposed to a fluid (for example, moisture) or not based on the measured resistance.

According to various embodiments of the disclosure, the operation of connecting the conductive member and the sensor may include the operation of connecting the conductive member and the sensor when the electronic device is detached from the body of the user.

According to various embodiments of the disclosure, the operation of executing a first action may include the operation of displaying at least one item of information related to the body of the user on a display of the electronic device.

According to various embodiments of the disclosure, the operation of executing a second action may include the operation of deactivating a charging function of the electronic device when it is determined that the conductive member has been exposed to a fluid (for example, moisture).

According to various embodiments of the disclosure, the operation of executing a second action may include the operation of activating a charging function of the electronic device when it is determined that the conductive member has not been exposed to a fluid (for example, moisture).

According to various embodiments of the disclosure, the operation of executing a second action comprises outputting fluid contact information when it is determined that the conductive member has been exposed to a fluid (for example, moisture).

According to various embodiments of the disclosure, the operation of executing a second action may include the operation of correcting sensor information when it is determined that the conductive member has been exposed to a fluid (for example, moisture).

According to various embodiments of the disclosure, the operation of executing a second action may include the operations of: detecting a fluid contact time of the electronic device when it is determined that the conductive member has been exposed to a fluid (for example, moisture); and estimating a fluid contact range of the electronic device based on the fluid contact time.

According to various embodiments of the disclosure, the method may further include the operation of interrupting power supply of the electronic device based on the fluid contact range of the electronic device.

According to various embodiments of the present disclosure, the electronic device may acquire the user's body information or determine whether a fluid contact occurs or not based on at least one of a voltage, a current, and a resistance value, which are caused by the conductive member 420, and which are provided from a sensor (for example, sensor 440).

The electronic device and a method for operating the same, according to various embodiments, confirm whether the corresponding electronic device contacts a fluid (for example, water) or not through a sensor (for example, GSR (galvanic skin reflex) sensor), which collects the user's body-related information, and therefore can determine whether the corresponding electronic device has contacted a fluid or not, without using an additional module for determining whether a fluid contact occurs or not.

The electronic device and a method for operating the same, according to various embodiments, interrupt charging that uses a conductive member (for example, connector), when a fluid contact of the conductive member is confirmed through a sensor, and therefore can prevent the conductive member from being corroded.

The electronic device and a method for operating the same, according to various embodiments, correct a sensor, when a fluid contact of the corresponding electronic device has been confirmed through the sensor, so as to correspond to the fluid contact and therefore can reduce input errors caused by the sensor.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a computer-readable storage medium in a programming module form. When an instruction is implemented by one or more processors (for example, the processor 120), one or more processors may execute a function corresponding to the instruction. The computer-readable storage medium may be, for example, the memory 130.

The computer readable recoding medium may include a hard disk, a floppy disk, magnetic media (for example, a magnetic tape), optical media (for example, a Compact Disc Read Only Memory (CD-ROM) and a Digital Versatile Disc (DVD)), magneto-optical media (for example, a floptical disk), a hardware device (for example, a Read Only Memory (ROM), a Random Access Memory (RAM), a flash memory), and the like. In addition, the program instructions may include high class language codes, which can be executed in a computer by using an interpreter, as well as machine codes made by a compiler. Any of the hardware devices as described above may be configured to work as one or more software modules in order to perform the operations according to various embodiments of the present disclosure, and vice versa.

The apparatuses and methods of the disclosure can be implemented in hardware, and in part as firmware or via the execution of software or computer code in conjunction with hardware that is stored on a non-transitory machine readable medium such as a CD ROM, a RAM, a floppy disk, a hard disk, or a magneto-optical disk, or computer code downloaded over a network originally stored on a remote recording medium or a non-transitory machine readable medium and stored on a local non-transitory recording medium for execution by hardware such as a processor, so that the methods described herein are loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc., that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor", "microprocessor" "controller", or "control unit" constitute hardware in the claimed disclosure that contain circuitry that is configured for operation. Under the broadest reasonable interpretation, the appended claims constitute statutory subject matter in compliance with 35 U.S.C. § 101 and none of the elements are software per se. No claim element herein is to be construed under the provisions of 35 U.S.C. 112, sixth paragraph, unless the element is expressly recited using the phrase "means for".

The definition of the terms "unit" or "module" as referred to herein are to be understood as constituting hardware circuitry such as a CCD, CMOS, SoC, AISC, FPGA, at least one processor or microprocessor (e.g. a controller or control unit) configured for a certain desired functionality, or a communication module containing hardware such as transmitter, receiver or transceiver, or a non-transitory medium comprising machine executable code that is loaded into and executed by hardware for operation, in accordance with statutory subject matter under 35 U.S.C. § 101 and do not constitute software per se. For example, the image processor in the present disclosure, and any references to an input unit and/or an output unit both comprise hardware circuitry configured for operation.

Any of the modules or programming modules according to various embodiments of the present disclosure may include at least one of the above described elements, exclude some of the elements, or further include other additional elements. The operations performed by the modules, programming module, or other elements according to various embodiments of the present disclosure may be executed in a sequential, parallel, repetitive, or heuristic manner. Further, some operations may be executed according to another order or may be omitted, or other operations may be added.

The embodiments disclosed herein are provided merely to easily describe technical details of the present disclosure and to help the understanding of the present disclosure, and are not intended to limit the scope of various embodiments of the present disclosure. Therefore, it should be construed that all modifications and changes or various other embodiments based on the technical idea of various embodiments of the present disclosure fall within the scope of various embodiments of the present disclosure.

What is claimed is:

1. An electronic device comprising:
   a housing;
   at least one sensor arranged in the housing;
   a coupling member connected to a part of the housing and configured to detachably couple the electronic device to a body part of a user;
   a conductive member arranged on one or more of a surface of the housing or a surface of the coupling member, and in which the conductive member is exposed to an exterior of the electronic device while being electrically connectible to the at least one sensor;
   one or more processors electrically connected to the at least one sensor; and
   a memory electrically connected to the one or more processors, wherein the memory stores instructions that, when executed, cause the one or more processors to:
   supply current to the conductive member in response to being contacted to the user's body,
   identify, based on the supplying the current, a resistance value corresponding to the conductive member,
   determine, based on the resistance value corresponding to the conductive member, whether the electronic device has contacted with fluid, and
   cut off power supply to the conductive member, if the electronic device has contacted with fluid.

2. The electronic device of claim 1, wherein the instructions cause the one or more processors to:
   identify whether the resistance value corresponding to the conductive member is lower than a stored resistance value, and
   determine that the electronic device has contacted with fluid based on identifying the resistance value corresponding to the conductive member is lower than the stored resistance value.

3. The electronic device of claim 1, wherein the instructions cause the one or more processors to adjust sensor information if the electronic device has contacted with fluid.

4. The electronic device of claim 1, wherein the instructions cause the one or more processors to display on a display of information regarding cutting off power supply to the conductive member.

5. The electronic device of claim 1, wherein the instructions cause the one or more processors to deactivate a charging function of the electronic device if the electronic device has contacted with fluid.

6. The electronic device of claim 1, wherein at least one of the surface of the housing or the surface of the coupling member contacts the user when the user wears the electronic device.

7. The electronic device of claim 1, wherein the conductive member comprises at least one of an antenna radiator and an outer electrode.

8. The electronic device of claim 1, wherein the at least one sensor comprises a Galvanic Skin Reflex sensor.

9. The electronic device of claim 1, wherein the electronic device further comprises:
   a battery mounted in the housing, the battery comprising at least one cell;
   a charging module electrically connected to the battery; and
   a switch electrically connected to the charging module, the at least one sensor, and the conductive member, and
   wherein the instructions cause the one or more processors to connect the conductive member and the at least one sensor through the switch such that current from the at least one sensor is supplied to the conductive member.

10. The electronic device of claim 9, wherein the instructions cause the one or more processors to interrupt the connection between the conductive member and the charging module by opening a switch, and maintain the connection between the conductive member and the at least one sensor through the switch if the electronic device has contacted with fluid.

11. A method for operating an electronic device, the method comprising:
    supplying current to a conductive member in response to contact to a user's body,
    identifying, based on the supplying the current, a resistance value corresponding to the conductive member,
    determining, based on the resistance value corresponding to the conductive member, whether the electronic device has contacted with fluid, and
    cutting off power supply to the conductive member, if the electronic device has contacted with fluid.

12. The method of claim 11, wherein determining, based on the resistance value corresponding to the conductive member, whether the electronic device has contacted with fluid comprises;
    identifying whether the resistance value corresponding to the conductive member is lower than a stored resistance value, and
    determining whether the electronic device has contacted with fluid based on identifying whether the resistance value corresponding to the conductive member is lower than the stored resistance value.

13. The method of claim 11, further comprising adjusting sensor information if the electronic device has contacted with fluid.

14. The method of claim 11, further comprising displaying information regarding cutting off power supply to the conductive member on a display of the electronic device.

15. The method of claim 11, wherein the cutting off power supply to the conductive member, if the electronic device has contacted with fluid, comprises deactivating a charging function of the electronic device if the electronic device has contacted with fluid.

16. The method of claim 11, wherein the conductive member comprises at least one of an antenna radiator and an outer electrode.

17. The method of claim 11, further comprising connecting the conductive member and at least one sensor through a switch, such that current from the at least one sensor is supplied to the conductive member.

18. The method of claim 17, further comprising interrupting the connection between the conductive member and a charging module by opening the switch, and maintaining the connection between the conductive member and the at least one sensor through the switch if the electronic device has contacted with fluid.

19. The method of claim 17, wherein the at least one sensor comprises a Galvanic Skin Reflex sensor.

* * * * *